US011678509B2

(12) United States Patent
Hyun et al.

(10) Patent No.: US 11,678,509 B2
(45) Date of Patent: Jun. 13, 2023

(54) DISPLAY DEVICE INCLUDING CORNER DAMS

(71) Applicant: Samsung Display Co., Ltd., Yongin-Si (KR)

(72) Inventors: Jin Ho Hyun, Gwacheon-si (KR); Hyoung Sub Lee, Yongin-si (KR); Hye Min Lee, Gimpo-si (KR); Woo Yong Sung, Seoul (KR)

(73) Assignee: Samsung Display Co., Ltd., Yongin-Si (KR)

( * ) Notice: Subject to any disclaimer, the term of this patent is extended or adjusted under 35 U.S.C. 154(b) by 109 days.

(21) Appl. No.: 17/322,956

(22) Filed: May 18, 2021

(65) Prior Publication Data

US 2022/0123256 A1    Apr. 21, 2022

(30) Foreign Application Priority Data

Oct. 16, 2020    (KR) ........................ 10-2020-0134334

(51) Int. Cl.
| | | |
|---|---|---|
| *H01L 27/32* | (2006.01) | |
| *H01L 51/52* | (2006.01) | |
| *G06F 1/16* | (2006.01) | |
| *G09F 9/33* | (2006.01) | |
| *H10K 50/844* | (2023.01) | |
| *H10K 50/842* | (2023.01) | |
| *H01L 27/146* | (2006.01) | |

(Continued)

(52) U.S. Cl.
CPC ....... *H10K 50/844* (2023.02); *H10K 50/8428* (2023.02); *H01L 27/14678* (2013.01); *H10K 59/40* (2023.02); *H10K 2102/00* (2023.02); *H10K 2102/311* (2023.02); *H10K 2102/351* (2023.02)

(58) Field of Classification Search
CPC .............. H01L 51/5253; H01L 51/525; H01L 51/5246; H01L 2251/301; H01L 2251/5338; H01L 2251/558; H01L 27/3246; H01L 27/3244; H01L 27/3295; H01L 27/323; H01L 27/14678; G06F 1/1637; G06F 1/1652; G06F 1/1626; G06F 9/33
See application file for complete search history.

(56) References Cited

U.S. PATENT DOCUMENTS

| | | | |
|---|---|---|---|
| 2018/0013092 A1 | 1/2018 | Park | |
| 2018/0082614 A1* | 3/2018 | You | ........................... F21V 9/08 |
| 2018/0259805 A1* | 9/2018 | Takehara | .......... G02F 1/136209 |

(Continued)

FOREIGN PATENT DOCUMENTS

| | | |
|---|---|---|
| CN | 106848107 A | 6/2017 |
| CN | 111161644 A | 5/2020 |

(Continued)

*Primary Examiner* — Ida M Soward
(74) *Attorney, Agent, or Firm* — Innovation Counsel LLP

(57) ABSTRACT

A display device includes: a substrate including a display area, the display area including a front area and a corner area disposed at a corner of the display area; a main dam disposed between the front area and the corner area; and a plurality of corner dams disposed in the corner area. The corner area may include a plurality of stripe areas defined by the plurality of corner dams. The plurality of corner dams extend from the main dam and is disposed along an edge of the plurality of stripe areas.

20 Claims, 28 Drawing Sheets

(51) Int. Cl.
   *H10K 59/40*     (2023.01)
   *H10K 102/00*    (2023.01)

(56) References Cited

U.S. PATENT DOCUMENTS

| | | |
|---|---|---|
| 2018/0350884 A1 | 12/2018 | Won et al. |
| 2020/0136088 A1* | 4/2020 | Yang .................... G09G 3/3225 |
| 2020/0170126 A1 | 5/2020 | Ahn et al. |
| 2020/0388788 A1* | 12/2020 | Long .................... H01L 27/3246 |
| 2021/0066649 A1* | 3/2021 | Wang ................... H01L 51/0097 |
| 2021/0226162 A1* | 7/2021 | Qian ....................... H01L 33/52 |
| 2021/0318770 A1 | 10/2021 | Joo et al. |
| 2021/0351376 A1* | 11/2021 | Xu ....................... H01L 51/5253 |
| 2021/0408458 A1* | 12/2021 | Lu ....................... H01L 51/5253 |

FOREIGN PATENT DOCUMENTS

| | | |
|---|---|---|
| KR | 10-2015-0027407 A | 3/2015 |
| KR | 10-2018-0011924 A | 2/2018 |
| KR | 10-2020-0063379 A | 6/2020 |
| KR | 10-2021-0127281 A | 10/2021 |

\* cited by examiner

DISPLAY DEVICE INCLUDING CORNER DAMS

CROSS-REFERENCE TO RELATED APPLICATION

This application claims priority to and the benefit of Korean Patent Application No. 10-2020-0134334 filed in the Korean Intellectual Property Office on Oct. 16, 2020, the entire contents of which are incorporated herein by reference.

BACKGROUND

(a) Technical Field

This disclosure relates to a display device, and more particularly, to a display device including a curved surface area.

(b) Description of the Related Art

A display device such as a light emitting diode display or a liquid crystal display is used for electronic devices such as smart phones, mobile phones, and multimedia terminals. Since the display device, particularly a screen of the display device, is a part exposed from the electronic device to the outside, the display device is a key element in a design of the electronic device.

Except for display devices such as those including cathode ray tubes, the commonly used display devices are flat panel display devices which have a flat surface. Recently, as flexible display devices have been developed, the screen has not been limited to have the flat surface but may be formed with a curved surface. Particularly, if the edge of the display device is formed with a curved-surface, a screen-to-body ratio of the display device may be increased. The screen-to-body ratio reflects a technology level of the display device and, at the same time, may play an important role in a consumer's standards of selection when purchasing products.

The above information disclosed in this Background section is only for enhancement of understanding of the background, and therefore it may contain information that does not form the prior art that is already known in this country to a person of ordinary skill in the art.

SUMMARY

An embodiment is to provide a display device with improved reliability and visibility while having an increased screen-to-body ratio.

A display device according to an embodiment includes a substrate including a display area, the display area including a front area and a corner area disposed at a corner of the display area; a main dam disposed between the front area and the corner area. The plurality of corner dams disposed in the corner area. The corner area may include a plurality of stripe areas defined by the plurality of corner dams and the plurality of corner dams extend from the main dam and is disposed along an edge of the plurality of stripe areas.

The substrate in plurality of stripe areas may be separated from each other.

The front area may have a flat surface, and the corner area may have a multi-curved surface. The plurality of stripe areas may form the multi-curved surface of the corner area.

Portions of the plurality of corner dams disposed at each of the plurality of stripe areas may be connected to the main dam to form stripe areas connect to the front area.

The display device may further include: a plurality of light emitting diodes (disposed in the front area and the plurality of stripe areas; and an encapsulation layer covering a plurality of light emitting diodes. The encapsulation layer may include an organic layer, and the organic layer is continuously disposed over the front area and the plurality of stripe areas.

A height thickness of the organic layer in the corner area may be is thinner than that in the front area.

The thickness of the organic layer may be changed in a boundary area disposed between the front area and the corner area.

The display device may further include at least one spacer disposed in the front area adjacent to the corner area and disposed corresponding to an area disposed between adjacent stripe areas of the plurality of stripe areas.

The height of the spacer may be higher than a height of the main dam.

The spacer may be covered by the organic layer.

The spacer may have a polygonal, circular, or semicircular shape in a plan view.

The spacer may be disposed spaced apart from the main dam or in contact with the main dam.

The main dam and the plurality of corner dams may each include a first layer, a second layer, and a third layer that are sequentially stacked, the first layer and the third layer include an organic insulating material, and the second layer includes an inorganic insulating material.

The second layer may be protruded from a top of the first layer in a cross-sectional view.

A display device according to an embodiment includes: a substrate including a display area, the display area including a front area and a corner area disposed at the corner of the display area; a plurality of light emitting diodes disposed in the display area; and an encapsulation layer covering the plurality of light emitting diodes and including an organic layer and an inorganic layer. A thickness of the organic layer disposed in the corner area may be thinner than that in the front area.

The organic layer may be disposed continuously over the front area and the corner area.

The thickness of the organic layer may be gradually changed in a boundary area disposed between the front area and the corner area.

An interval between a first light emitting diode disposed adjacent to the corner area in the front area and a second light emitting diode disposed adjacent to the first light emitting diode in the corner area may be the same as an interval between light emitting diodes disposed adjacent to each other in the front area.

The display device may further include: a main dam disposed between the front area and the corner area and a plurality of corner dams disposed in the corner area. The a plurality of stripe areas defined by the plurality of corner dams and the main dam and the plurality of corner dams are continuously formed.

The display device may further include a spacer disposed adjacent to the corner area in the front area and has a height higher than that of the main dam.

According to the embodiments, a display device having an increased screen-to-body ratio and improved reliability and visibility may be provided, and process capability for manufacturing the display device may be improved. In addition, according to the embodiments, there are advantageous effects that may be recognized throughout the specification.

DETAILED DESCRIPTION OF THE EMBODIMENTS

Figure 1:
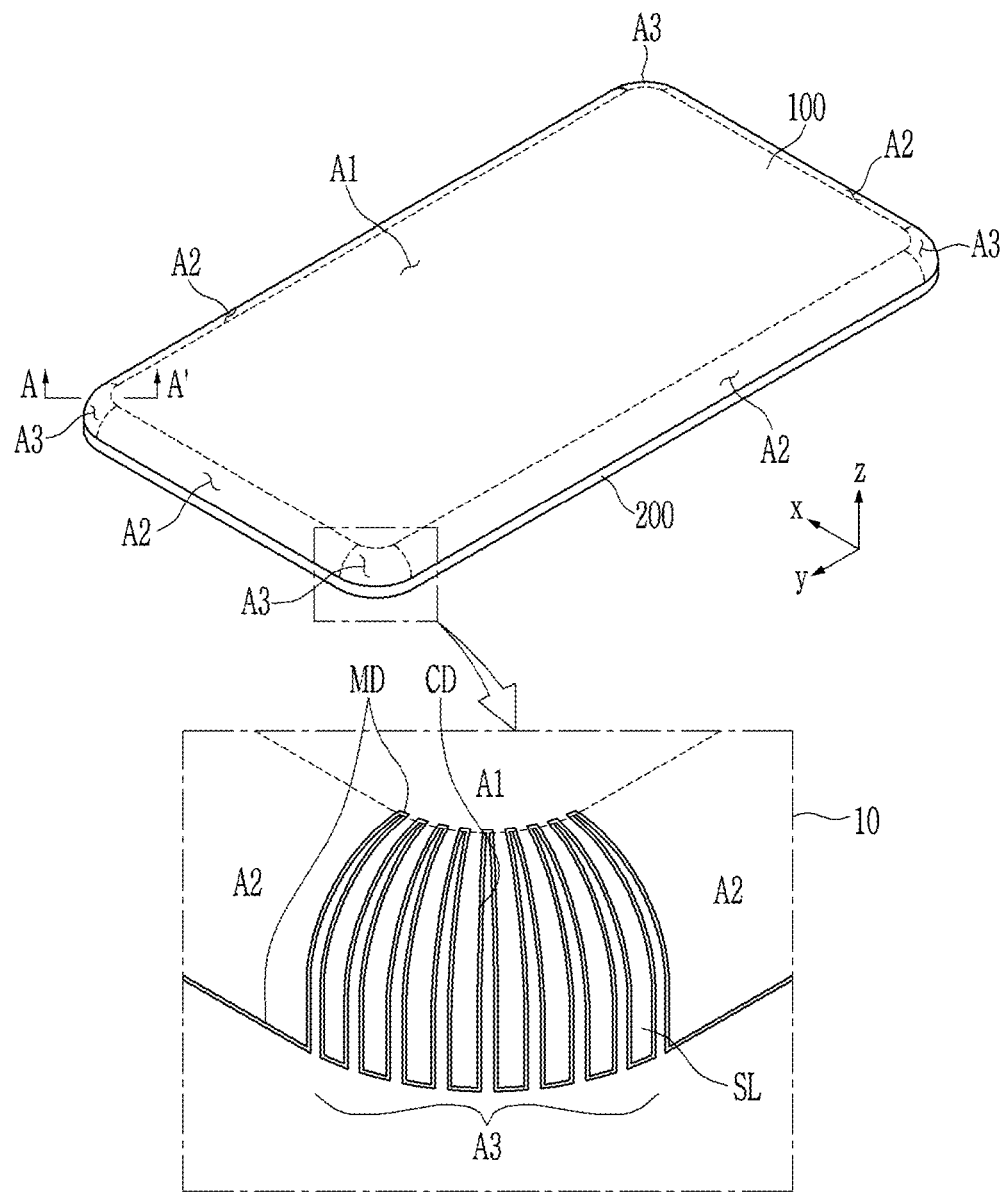
FIG. 1 is a schematic perspective view of an electronic device to which a display device according to an embodiment is applied.

Embodiments will be described in detail with reference to accompanying drawings so that those skilled in the art to which the inventive concept belongs can easily implement them.

It will be understood that when an element such as a layer, film, area, or substrate is referred to as being "on" another element, it can be directly on the other element or intervening elements may also be present. In contrast, when an element is referred to as being "directly on" another element, there are no intervening elements present.

In addition, unless explicitly described to the contrary, the word "comprise" and variations such as "comprises" or "comprising" will be understood to imply the inclusion of stated elements but not the exclusion of any other elements.

Throughout the specification, "connected" does not only mean that two or more constituent elements are directly connected, but also when two or more constituent elements are connected indirectly through other constituent elements, and it may include a case where substantially integral parts are connected to each other even if they may be referred to by a different name depending on the position or function, as well as the case of being physically connected or electrically connected.

In the drawings, symbols "x", "y", and "z" representing directions are used, where "x" is a first direction, "y" is a second direction perpendicular to the first direction, and "z" is a third direction perpendicular to the first direction and the second direction. The first direction x, the second direction y, and the third direction z may correspond to a horizontal direction, a vertical direction, and a thickness direction of the display device, respectively.

Unless otherwise specified in the specification, "overlapping" means overlapping in a plan view and overlapping in the third direction z.

Figure 2:
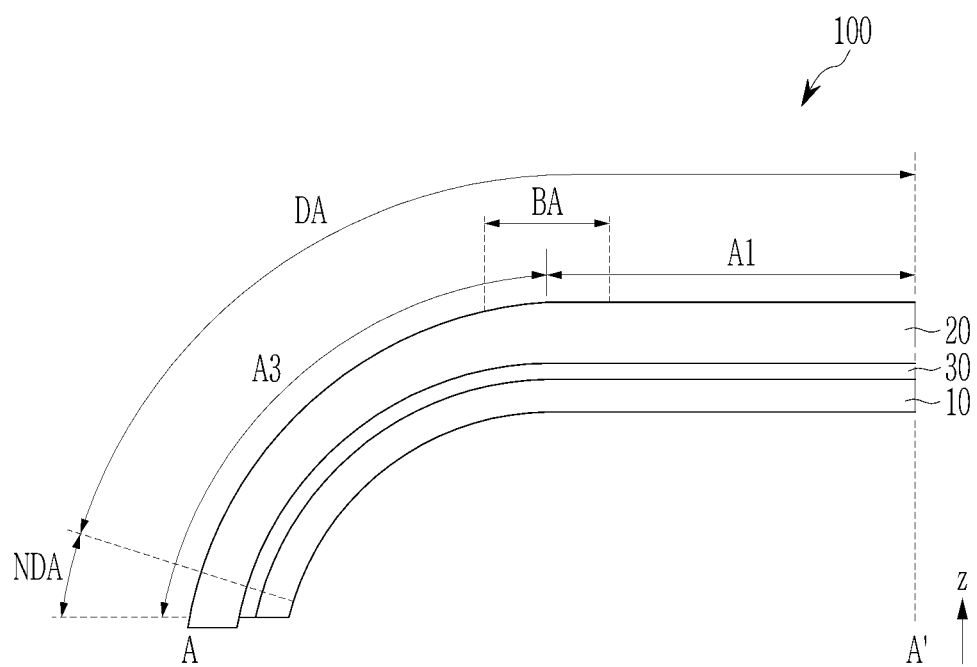
FIG. 2 is a schematic cross-sectional view of a display device of FIG. 1 taken along a line A-A'.

FIG. 1 is a schematic perspective view of an electronic device to which a display device according to an embodiment is applied, and FIG. 2 is a schematic cross-sectional view of a display device of FIG. 1 taken along a line A-A'.

Referring to FIG. 1, a display device 100 according to an embodiment may be used for electronic devices such as smart phones, mobile phones, tablets, multimedia players, and game consoles. The electronic device may include a display device 100 and a housing 200. The display device 100 may provide a screen on which an image is displayed in the electronic device. The housing 200 may be referred to as a set frame and may accommodate the display device. In the internal space defined by the display device 100 and the housing 200, various parts constituting the electronic device may be disposed. For example, a processor, memory, a battery, a drive device, a camera, a speaker, a microphone, a receiver, a communication module, and various sensors may be disposed inside the electronic device.

The entire front of the electronic device may correspond to the screen and at least a portion of the side surface may correspond to the screen. The screen may correspond to the display area DA of the display device 100. The display device may include a display area DA which includes a front area A1 facing a front of the display device, side areas A2 disposed on sides of the front area A1, and corner areas A3 disposed at corners of the display area DA.

The front area A1 is located at a center of the display device 100 and may occupy most of the display area DA. The side areas A2 and corner areas A3 may be disposed to surround the front area A1. The front area A1 may constitute a front display area. Most of the side areas A2 may constitute the side display area, and most of the corner areas A3 may constitute the corner display area. The front area A1 may have a flat surface, and the side areas A2 and the corner areas A3 may have curved surfaces. The edge portion of the side areas A2 and the edge portion of the corner areas A3 may be a non-display area NDA. The front area A1, the side area A2, and the corner area A3 may be a first area, a second area, and a third area of the display device 100, respectively.

The front area A1 may occupy the widest area in the entire display area DA and may form a substantially flat screen. In a layout view, the front area A1 may have a rectangular shape having four sides. The corners of the front area A1 may be rounded as shown but may also have fight angle. The four sides of the front area A1 may be parallel to the first direction x or the second direction y, respectively.

The side areas A2 may be respectively connected to four sides of the front area A1. Each side area A2 may have a curved surface and a curvature of the curved surface may be constant or different depending on the position of the curved surface. Each side area A2 may have a shape similar to a portion (e.g., ¼) of a curved-surface column such as an elliptical column and a cylinder.

The corner areas A3 may be disposed in the four corners of the display device 100. Each corner area A3 may be disposed between two adjacent side areas A2. Each corner area A3 has the curved surface and the curvature of the curved surface may be constant or different depending on the position of the curved-surface. The shape of the curved surface of the corner area A3 may be different from that of the side area A2. For example, each corner area A3 may have a shape similar to a portion (e.g., ⅛) of a curved-surface body such as a spherical or elliptical sphere.

When the electronic device is viewed from the front, the screen of display device which includes the entire front area A1, the side areas A2, and the corner areas A3 may have the rectangular shape having rounded corners. The housing 200 may be invisible or almost invisible, and a bezel-less electronic device with the screen-to-body ratio of 1 or nearly 1 may be substantially implemented.

Referring to FIG. 2, the display device 100 may include a display panel 10, a window 20, and an adhesive layer 30. In the display device 100, the image may be displayed by the display panel 10, and the window 20 may transmit the image displayed on the display panel 10 while covering the display panel 10. Therefore, the front area A1, the side areas A2, and the corner areas A3 of the display device 100 may be described in the same concept as the front area A1, the side areas A2, and the corner areas A3 of the display panel 10.

The display panel 10 may be flexible in at least one portion. In the display panel 10, the pixels are arranged on a substrate, and the image may be displayed by a combination of the pixels. In the front area A1 as well as the side areas A2 and the corner areas A3, the pixels including, for example, red pixels, green pixels, and blue pixels are arranged. The pixels may be disposed over the entire front area A1 and major portions of the side areas A2 and the corner areas A3. Therefore, the area of the entire front area A1 and the major portions of the side areas A2 and the corner areas A3 may be the display area DA. The edge portion of the side areas A2 and the edge portion of the corner areas A3 may be a non-display area NDA (i.e., an area where the pixels are not disposed). In the non-display area NDA, a dam surrounding the display area DA may be disposed.

In the display panel 10, pixel circuits and signal lines to drive the pixels are disposed. The display panel 10 may be a light-emitting display panel including light-emitting elements. The display panel 10 may include a touch sensor layer capable of detecting a touch.

The window 20 is a kind of a cover to protect the display panel 10 from an external impact. The window 20 may act as a supporting member to maintain the curved-surface state of the display panel 10. The window 20 is made of a transparent and hard material such as glass or plastic so that the user may see the image displayed on the screen of the display panel 10.

The display panel 10 may be attached to the window 20 by an adhesive layer 30 formed by an adhesive such as an OCA (optically clear adhesive), an OCR (optically clear resin), or a PSA (pressure sensitive adhesive). The display device 100 may be flat in the front area A1 and may be curved with a predetermined curvature radius to form the curved surface in the side areas A2 and the corner areas A3. The curvature radius may be constant or variable depending on the position. The side areas A2 may be single curved surfaces and the corner areas A3 may be a multi-curved surface.

The partial enlarged view in FIG. 1 shows the corner area A3 of the display panel 10 and the front area A1 and the side areas A2 adjacent thereto. In order to implement the multi-curved surface of the corner area A3, the corner area A3 may have a plurality of non-display areas NDAs and a plurality of display areas DAs disposed between adjacent non-display areas NDAs. The non-display areas NDAs of the corner area A3 may be areas in which pixels does not exist, light from the pixels is blocked not to emit toward the user, or a substrate forming the display panel 10 is completely cut out in the thickness direction. That is, the corner area A3 may include stripe areas SA which are display areas DAs disposed between adjacent non-display areas NDAs. Each stripe area SA may extend approximately radially from the edge of the front area A1. In each stripe area SA, the pixels may be arranged in one or more columns along the length direction of the stripe area SA. The stripe areas SA may be combined to form the multi-curved surface of the corner area A3. The edges of the stripe areas SA may define the edge of the corner area A3. The stripe areas SA may be stretchable.

The front area A1 and the side area A2 may include one physically continuous substrate and layers stacked thereon. The front area A1 and the corner area A3 may include one physically continuous substrate and layers stacked thereon. Between the side area A2 and the corner area A3, the substrate may be physically discontinuous or may be continuous. The substrate may be physically discontinuous or continuous between the adjacent stripe areas SA. The display panel 10, as shown in FIG. 2, may include a boundary area BA, which is near the boundary of the front area A1 and the corner area A3. In the boundary area BA, the starting line of the multi-curved surface or the curved-surface of the corner area A3 may be disposed. The width of the boundary area BA may correspond approximately to the distance between the light emitting diode LED in the front area A1 and the light emitting diode LED in the corner area A3 adjacent to each other.

Figure 3:
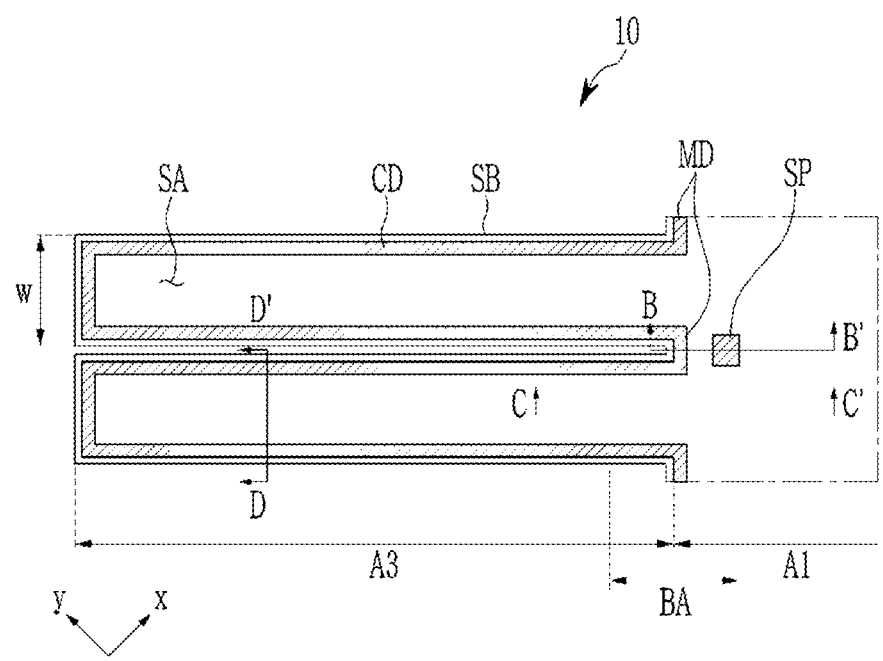
FIG. 3 is a top plan view schematically showing a part of one corner area and a front area adjacent thereto in a display panel according to an embodiment.
Figure 4:
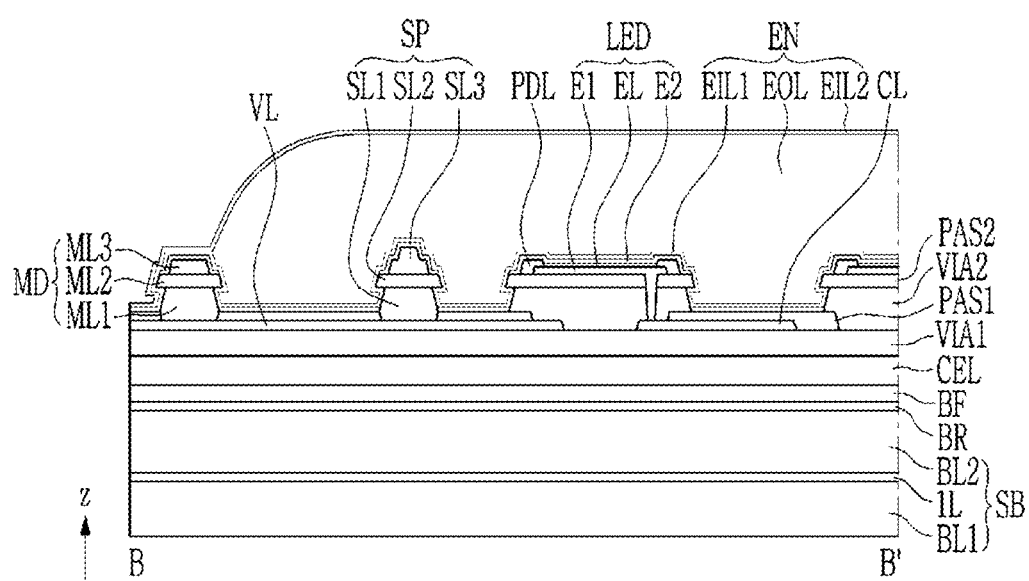
FIG. 4 is a schematic cross-sectional view of a display device of FIG. 3 taken along a line B-B'.
Figure 5:
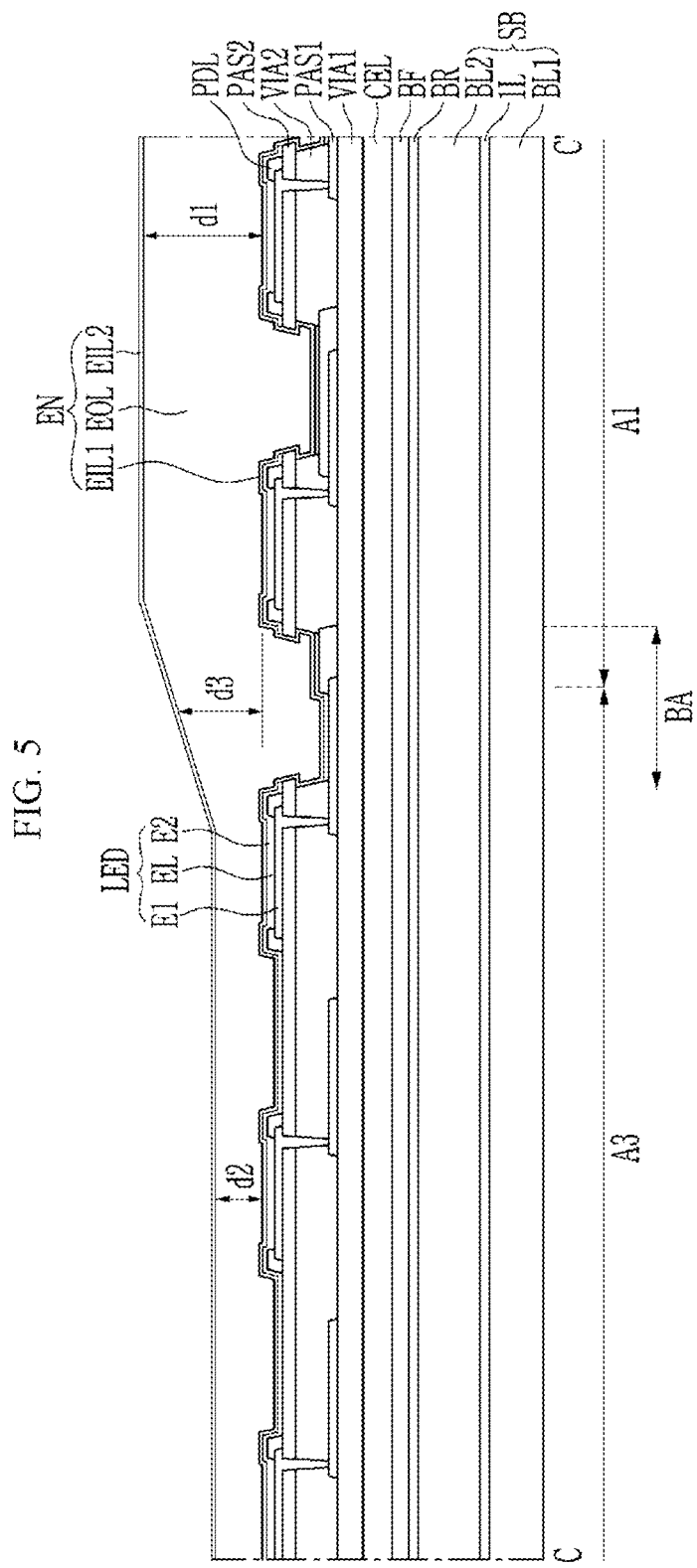
FIG. 5 is a schematic cross-sectional view of a display device of FIG. 3 taken along a line C-C'.
Figure 6:
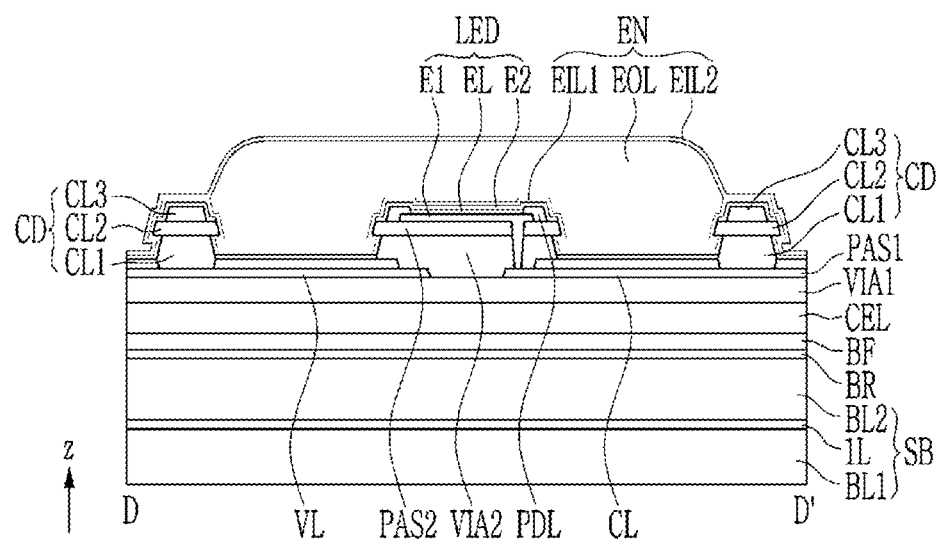
FIG. 6 is a schematic cross-sectional view of a display device of FIG. 3 taken along a line D-D'.

FIG. 3 is a top plan view schematically showing a part of one corner area A3 and a front area A1 adjacent thereto in a display panel 10 according to an embodiment. FIG. 4 is a schematic cross-sectional view of a display panel 10 of FIG. 3 taken along a line B-B', FIG. 5 is a schematic cross-sectional view of a display panel 10 of FIG. 3 taken along a line C-C', and FIG. 6 is a schematic cross-sectional view of a display panel 10 of FIG. 3 taken along a line D-D'.

Referring to FIG. 3, among the stripe areas SA constituting the corner area A3, two neighboring stripe areas SA are shown. The stripe areas SA may be protruded approximately radially from the front area A1.

The display panel 10 may include a main dam MD disposed approximately at the border of the front area A1 and the corner area A3, and a corner dam CD disposed at the edge of the stripe areas SA.

Although not shown, the main dam MD) may be positioned along the edge of the side area A2 adjacent to the display panel 10. The main dam MD may surround the front area A1 and the side area A2. That is, the main dam MD may be disposed along the edge of the display panel 10 in an area except for the corner area A3, and the dam may not be disposed between the front area A1 and the side area A2.

There is no dam between the front area A1 and the side area A2, and the corner dam CD may surround a portion of the stripe area SA protruding from the front area A1. The corner dam CD may be connected to the main dam MD. The corner dam CD may extend radially from the main dam MD toward the edge of the display panel 10 at the corner. The portions of the corner dam CD disposed in each stripe area SA may be connected by the main dam MD. The main dam MD and/or the corner dam CD may not be disposed between the front area A1 and the stripe area SA. That is, the stripe area SA may not be separated from the front area A1 by a dam such as the main dam MD and/or the corner dam CD. In the corner area A3 and the boundary area BA, the main dam MD and the corner dam CD may form a protrusions and recesses. The main dam MD and the corner dam CD may surround the display area DA.

A spacer SP may be disposed adjacent to the corner area A3 in the front area A1. The spacer SP may be disposed to be aligned with the non-display area NDA disposed between two stripe areas SA. That is, the spacer SP may be disposed in a space between the adjacent stripe areas SA in a length direction of the stripe area SA.

While explaining the cross-section structure of the display panel 10, the main dam MD, the corner dam CD, and the spacer SP are described in more detail.

Referring to FIG. 3, FIG. 4, FIG. 5, and FIG. 6, the display panel 10 may include a substrate SB and several layers and elements disposed on the substrate SB. The front area A1, the side areas A2, and the corner areas A3 of the display panel 10 may be described in the same concept as the front area A1, the side areas A2, and the corner areas A3 of the substrate SB.

The substrate SB may be a flexible substrate capable of bending, folding, or rolling. The substrate SB may be a multilayer including a first base layer BL1, an inorganic layer IL and a second base layer BL2. The first and second base layers BL1 and BL2 may include polymer resins such as a polyimide, a polyamide, and polyethylene terephthalate. The substrate SB may be cut and separated in the corner area A3 to correspond to each stripe area SA.

A barrier layer BR may be disposed on the substrate SB, and a buffer layer BF may be disposed on the barrier layer BR. The barrier layer BR and the buffer layer BF may include an inorganic insulating material such as a silicon nitride ($SiN_x$), a silicon oxide ($SiO_x$), a silicon oxynitride ($SiO_xN_y$), etc.

A circuit element layer CEL may be disposed on the buffer layer BF. The circuit element layer CEL may include pixel circuits and signal lines for driving the pixels. The circuit element layer may include a semiconductor layer, a first gate conductive layer, a second gate conductive layer, and a first data conductive layer, and insulating layers therebetween. A more detailed configuration of the circuit element layer CEL will be described later.

A first planarization layer VIA1 may be disposed on the circuit element layer CEL. The first planarization layer VIA1 may be an organic insulating layer. For example, the first planarization layer VIA1 may include an organic insulating material such as a generally used polymer such as poly(methyl methacrylate) and polystyrene, polymer derivatives having a phenol-based group, an acryl-based polymer, an imide polymer, a polyimide, a siloxane-based polymer, etc.

On the first planarization layer VIA1, a second data conductive layer including a voltage line VL, a connection line CL, etc. may be disposed. The second data conductive layer may include aluminum (Al), platinum (Pt), palladium (Pd), silver (Ag), magnesium (Mg), gold (Au), nickel (Ni), neodymium (Nd), iridium (Jr), chromium (Cr), nickel (Ni), calcium (Ca), molybdenum (Mo), titanium (Ti), tungsten (W), copper (Cu), and the like.

A first passivation layer PAS1 may be disposed on the second data conductive layer. The first passivation layer PAS1 may include an inorganic insulating material such as a silicon nitride, a silicon oxide, a silicon oxynitride, etc.

A second planarization layer VIA2 may be disposed on the second data conductive layer. Most of the second planarization layer VIA2 may not overlap the first passivation layer PAS1. The second planarization layer VIA2 may cover the edge of the first passivation layer PAS1. The second planarization layer VIA2 may be an organic insulating layer. For example, the second planarization layer VIA2 may include an organic insulating material such as a generally used polymer such as poly(methyl methacrylate) and polystyrene, polymer derivatives having a phenol-based group, an acryl-based polymer, an imide polymer, a polyimide, a siloxane-based polymer, etc.

The second planarization layer VIA2 may constitute the first layer ML1 of the main dam MD, the first layer CL1 of the corner dam CD, and the first layer SL1 of the spacer SP. That is, the first layer ML1 of the main dam MD, the first layer CL1 of the corner dam CD, and the first layer SL1 of the spacer SP may be formed of the same material in the same process as the second planarization layer VIA2.

A second passivation layer PAS2 may be disposed on the second planarization layer VIA2. The second passivation layer PAS2 may include an inorganic insulating material such as a silicon nitride, a silicon oxide, a silicon oxynitride, etc. Most of the second passivation layer PAS2 may not overlap the first passivation layer PAS1. However, the edge portion of the second passivation layer PAS2 may overlap the edge portion of the first passivation layer PAS1.

The second passivation layer PAS2 may constitute the second layer ML2 of the main dam MD, the second layer CL2 of the corner dam CD, and the second layer SL2 of the spacer SP. That is, the second layer ML2 of the main dam MD, the second layer CL2 of the corner dam CD, and the second layer SL2 of the spacer SP may be formed of the same material in the same process as the second passivation layer PAS2. The main dam MD of the second layer ML2 may be protruded to both sides of the upper end of the first layer ML1 in a cross sectional view. The second layer CL2 of the corner dam CD may be protruded to both sides of the upper end of the first layer CL1 in a cross sectional view. The second layer SL2 of the spacer SP may be protruded to both sides of the upper end of the first layer SL1 in a cross sectional view.

A first electrode E1 of the light emitting diode LED may be disposed on the second passivation layer PAS2. A pixel definition layer PDL may be disposed on the first electrode E1 and the second passivation layer PAS2. The pixel definition layer PDL may cover an edge of the first electrode E1. The pixel definition layer PDL may have an opening exposing the first electrode E1. The pixel definition layer PDL may be an organic insulating layer. For example, the pixel definition layer PDL may include an organic insulating material such as a generally used polymer such as poly (methyl methacrylate) and polystyrene, polymer derivatives having a phenol-based group, an acryl-based polymer, an imide polymer, a polyimide, a siloxane-based polymer, etc.

The pixel definition layer PDL may constitute the third layer ML3 of the main dam MD, the third layer CL3 of the corner dam CD, and the third layer SL3 of the spacer SP. That is, the third layer ML3 of the main dam MD, the third layer CL3 of the corner dam CD, and the third layer SL3 of the spacer SP may be formed of the same material in the same process as the pixel definition layer PDL.

An emission layer EL of the light emitting diode LED may be disposed on the first electrode E1.

A second electrode E2 of the light emitting diode LED may be disposed on the emission layer EL. The second electrode E2 may be continuously disposed over a plurality of light emitting diodes LED. The second electrode E2 may not be disposed outside the main dam MD and the corner dam CD. The second electrode E2 may not be disposed on the side of the second planarization layer VIA2. One light emitting diode LED may be disposed to correspond to one pixel.

A capping layer (not shown) for controlling a refractive index may be disposed on the second electrode E2.

An encapsulation layer EN entirely covering the display area DA may be disposed on the second electrode E2. The encapsulation layer EN seals the display area DA, particularly the light emitting diodes LED, to prevent moisture or oxygen from penetrating into the display panel 10. The edge of the encapsulation layer EN may be positioned between the edge of the display panel 10 and the display area DA.

The encapsulation layer EN may be a thin film encapsulation layer in which a first inorganic layer EIL1, an organic layer EOL, and a second inorganic layer EIL2 are sequentially stacked. The first and second inorganic layers EIL1 and EIL2 may include inorganic insulating materials such as a silicon nitride, a silicon oxide, a silicon oxynitride, and an aluminum oxide. The organic layer EOL may include an acryl-based resin, a methacrylic-based resin, polyisoprene, a vinyl-based resin, an epoxy-based resin, a urethane-based resin, a cellulosic-based resin, a perylene-based resin, and the like.

The first inorganic layer EIL1 and the second the inorganic layer EIL2 may be formed over a wider area than the organic layer EOL. In the edge area of the encapsulation layer EN, the first the inorganic layer EIL1 and the second the inorganic layer EIL2 may be in direct contact. The edge of the first inorganic layer EIL1 and the edge of the second inorganic layer EIL2 may approximately coincide. By forming the first and second inorganic layers EIL1 and EIL2 to be in direct contact, it is possible to prevent the penetration of moisture or oxygen from the side of the display panel 10 into the display device to the light emitting diode LED.

The encapsulation layer EN may be continuously disposed to cover the front area A1, the side areas A2 the corner areas A3. As well as the first and second the inorganic layers EIL1 and EIL2, the organic layer EOL may be disposed continuously over the front area A1, the side areas A2 and the stripe areas SA in the corner areas A3. The thickness of the encapsulation layer EN, particularly the organic layer EOL, may be thinner in the corner area A3 than in the front area A1. That is, the height of the organic layer EOL based on the upper surface of the substrate SB may be lower in the corner area A3 than in the front area A1.

The organic layer EOL may be formed by coating an organic material such as a monomer (hereinafter, also referred to as a material forming an organic layer) through an inkjet process and then curing it. If the width w of the stripe area SA of the corner area A3 is narrow (e.g., about 200 μm or less), the organic material may overflow when forming the organic layer EOL in the corner area A3, so it may be difficult to form the organic layer EOL to be thick in the corner area A3. Based on the area overlapping the emission layer EL, the first thickness d1 of the organic layer EOL in the front area A1 may be about 6 μm to about 10 μm, and the second thickness d2 of the organic layer EOL in the corner area A3 may be about 2 μm to about 6 μm. For example, the first thickness d1 may be about 8 μm, and the second thickness d2 may be about 4 μm. However, the thickness of the organic layer EOL may be substantially uniform over the front area A1 and the corner area A3 according to the width w of the stripe area SA, a process capability, and the characteristic of the organic layer forming material.

In order to minimize visual recognition of the boundary between the front area A1 and the corner area A3, a portion of which the thickness of the organic layer EOL changes may be disposed in the boundary area BA. That is, in the boundary area BA between the front area A1 and the corner area A3, a third thickness d3 of the organic layer EOL may gradually change between the first thickness d1 and the second thickness d2. The boundary area BA is an area where the display panel 10 changes from the flat surface to the curved surface, so it may be difficult to recognize the difference in luminance due to the thickness change of the organic layer EOL. The spacing between the light emitting diodes LED in the front area A1 and the light emitting diodes LED in the corner area A3 may be substantially the same. By maintaining the interval between adjacent light emitting diodes LED constant, the difference in luminance between the front area A1 and the corner area A3 may be minimized, and the boundary between the front area A1 and the corner area A3 may be minimized from being recognized.

The main dam MD may include a first layer ML1, a second layer ML2, and a third layer ML3 which are sequentially stacked. The corner dam CD may include a first layer CL1, a second layer CL2, and a third layer CL3 which are sequentially stacked. The spacer SP may include a first layer SL1, a second layer SL2, and a third layer SL3 which are sequentially stacked. In the main dam MD, the width of the second layer ML2 may be wider than that of the third layer ML3 in a cross-sectional view. In the corner dam CD, the width of the second layer CL2 may be wider than that of the third layer CL3 in a cross-sectional view. In the spacer SP, the width of the second layer SL2 may be wider than that of the third layer SL3 in a cross-sectional view. In the main dam MD, the second layer ML2 may be protruded to both sides of the upper end of the first layer ML1 in a cross-sectional view. In the corner dam CD, the second layer CL2 may be protruded to both sides of the upper end of the first layer CL1 in a cross-sectional view. In the spacer SP, the second layer SL2 may be protruded to both sides of the upper end of the first layer SL1 in a cross-sectional view. The main dam MD, the corner dam CD, and/or the spacer SP may contain fewer or more layers than shown.

The main dam MD and the corner dam CD may surround the display area DA. The main dam MD and the corner dam CD may prevent organic materials such as monomers from overflowing to the outside of the display panel 10 when forming the organic layer EOL of the encapsulation layer EN. Accordingly, the edge of the organic layer EOL may be disposed inside of the main dam MD and the corner dam CD, that is, in the area defined by the main dam MD and the corner dam CD. The first and second inorganic layers EIL1 and EIL2 of the encapsulation layer EN may be positioned above the main dam MD and the corner dam CD and may be formed to extend to the outside of the main dam MD and the corner dam CD. Accordingly, the contact area between the first inorganic layer EIL1 and the second inorganic layer EIL2 increases, so the adhesion between the first inorganic layer EIL1 and the second inorganic layer EIL2 may increase.

The spacer SP may be formed higher than the main dam MD. The spacer SP may support a mask (e.g., a fine metal mask) used when forming the emission layer EL. If the spacer SP is damaged by the mask to have pressure marks, defects may occur in the second inorganic layer EIL2 due to the damaged area of the spacer SP. Foreign particles, moisture and oxygen may penetrate through the defective part of the second the inorganic layer EIL2. However, since the spacer SP is covered by the organic layer EOL, reliability may not be deteriorated due to the damaged portion of the spacer SP.

The spacer SP may also control the flow of the organic material for forming the organic layer EOL of the encapsulation layer EN. In other words, it is possible to guide the organic material in the front area A1 to flow to the stripe areas SA in the corner area A3 without overflowing the main dam MD. Since the corner dam CD is connected to the main dam MD and the dam does not block between the front area A1 and the corner area A3, the organic material may flow from the front area A1 to the corner area A3. In addition, since the organic material may not be coated directly or is thinly coated to the stripe areas SA, it is possible to prevent the overflow of the organic material in the stripe areas SA, and the process capability for forming the organic layer EOL may be secured. Consequently, the reliability and the process capability of the display panel 10 may be improved by the connection structure of the main dam MD and the corner dam CD and the positioning of the spacer SP as in the embodiment.

Figure 7:
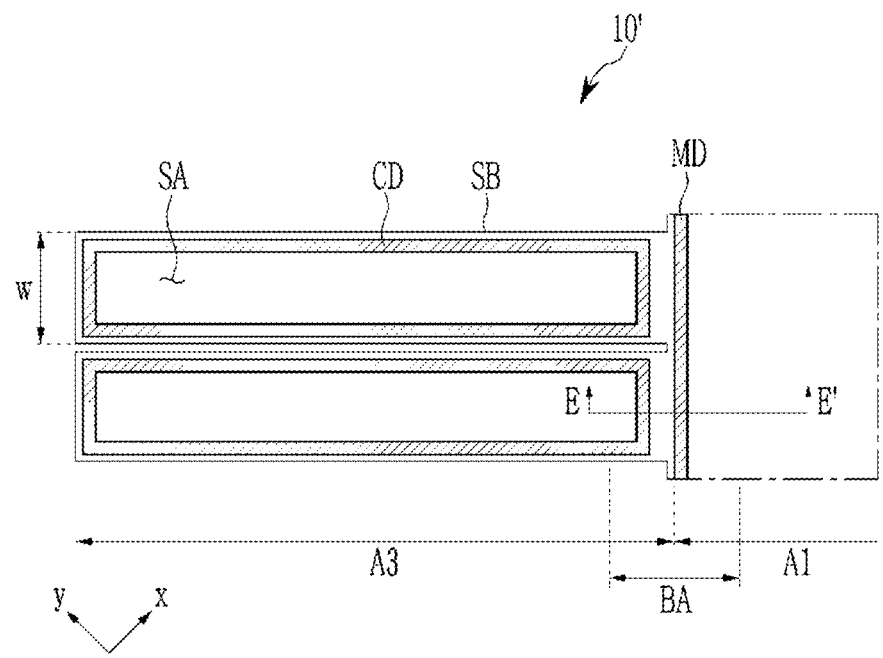
FIG. 7 is a top plan view schematically showing a part of one corner area and a front area adjacent thereto in a display panel according to a comparative example.
Figure 8:
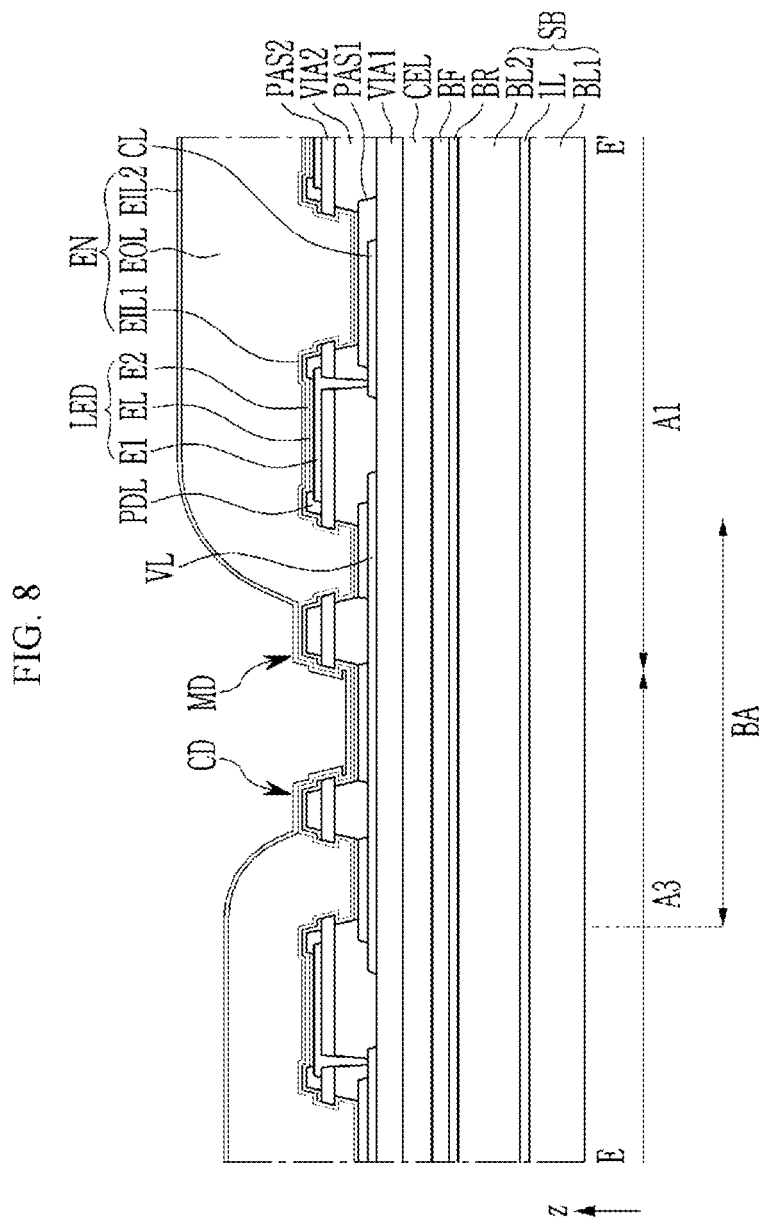
FIG. 8 is a schematic cross-sectional view of a display device of FIG. 7 taken along a line E-E'.

FIG. 7 is a top plan view schematically showing a part of one corner area and a front area adjacent thereto in a display panel according to a comparative example, and FIG. 8 is a schematic cross-sectional view of a display device of FIG. 7 taken along a line E-E'.

Referring to FIG. 7 and FIG. 8, as shown in the above-described embodiment, the corner area A3, which is positioned at the corner of the front area A1, may include the stripe areas SA separated from each other. However, unlike the above-described embodiment, the main dam MD and the corner dam CD are separated. The corner dam CD disposed in the corner area A3 is formed to individually surround the display area DA in each stripe area SA.

The first and second inorganic layers EIL1 and EIL2 of the encapsulation layer EN may be disposed continuously over the front area A1 and the stripe areas SA. The organic layers EOL of the encapsulation layer EN disposed in the area surrounded by the main dam MD and disposed in the area surrounded by the corner dam CD are not connected to each other but are separated from each other. That is, the organic layer EOL may not be disposed between the main dam MD and the corner dam CD in the boundary area BA.

The main dam MD and the corner dam CD may be damaged by the mask to have pressure marks in the boundary area BA. However, since the portions with such damaged portions are not covered by the organic layer EOL, defects (e.g., cracks, delamination, tearing, etc.) or a portion on which the second inorganic layers EIL2 is not formed in the encapsulation layer EN may be exist in the second inorganic layer EIL2, and moisture, oxygen, etc. may penetrate through the defective portions.

Because the organic layer EOL is not disposed between the main dam MD) and the corner dam CD), the difference in the luminance may occur due to the difference in the thickness of the organic layer EOL in the front area A1 and the corner area A3. In addition, since the main dam MD and the corner dam CD are disposed in the boundary area BA, the spacing between the light emitting diodes LED disposed on opposing sides of the boundary area BA may be wider than the spacing between the light emitting diodes LED in the front area A1 or the corner area A3. Due to this, the boundary between the front area A1 and the corner area A3 or the boundary area BA may be visually recognized. In addition, when the organic material is coated to the stripe area SA for the formation of the organic layer EOL, the organic material may overflow the corner dam CD due to the narrow width of the stripe area SA.

In the above-described embodiment, as described above, problems that may occur in the comparative example may be prevented, and the process capability for forming the organic layer EOL may be improved.

Figure 9A:
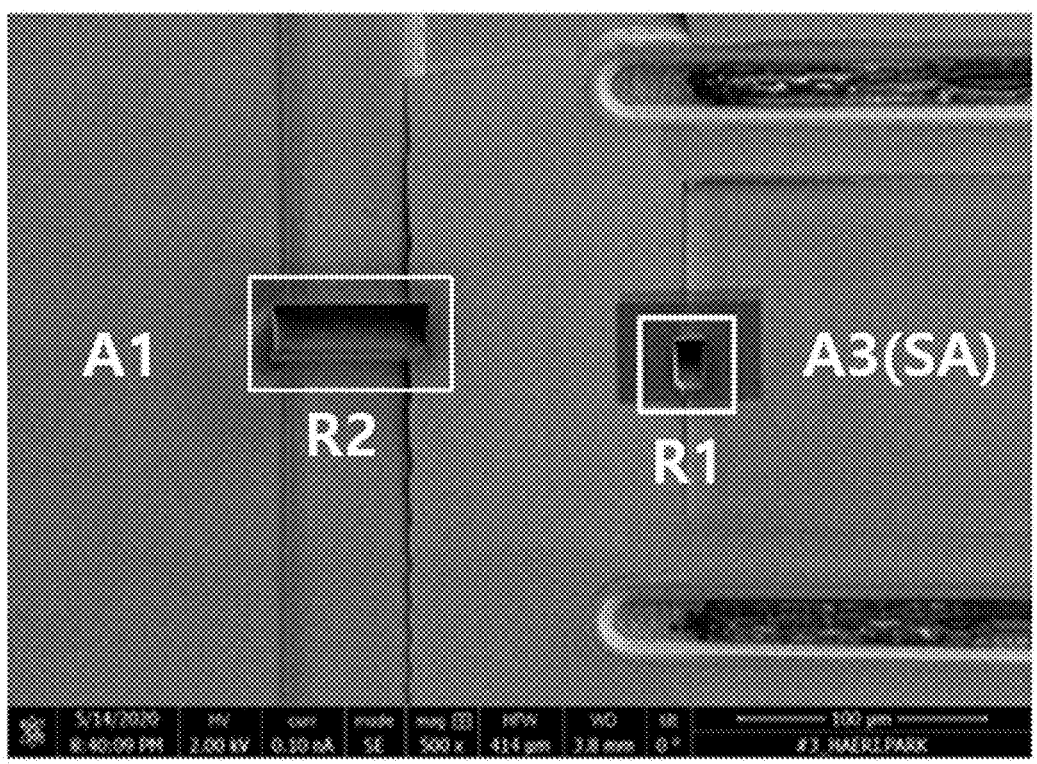
FIG. 9A, FIG. 9B, and FIG. 9C are transmission electron micrographs of a boundary area and a vicinity thereof in a display panel according to a comparative example.
Figure 9B:
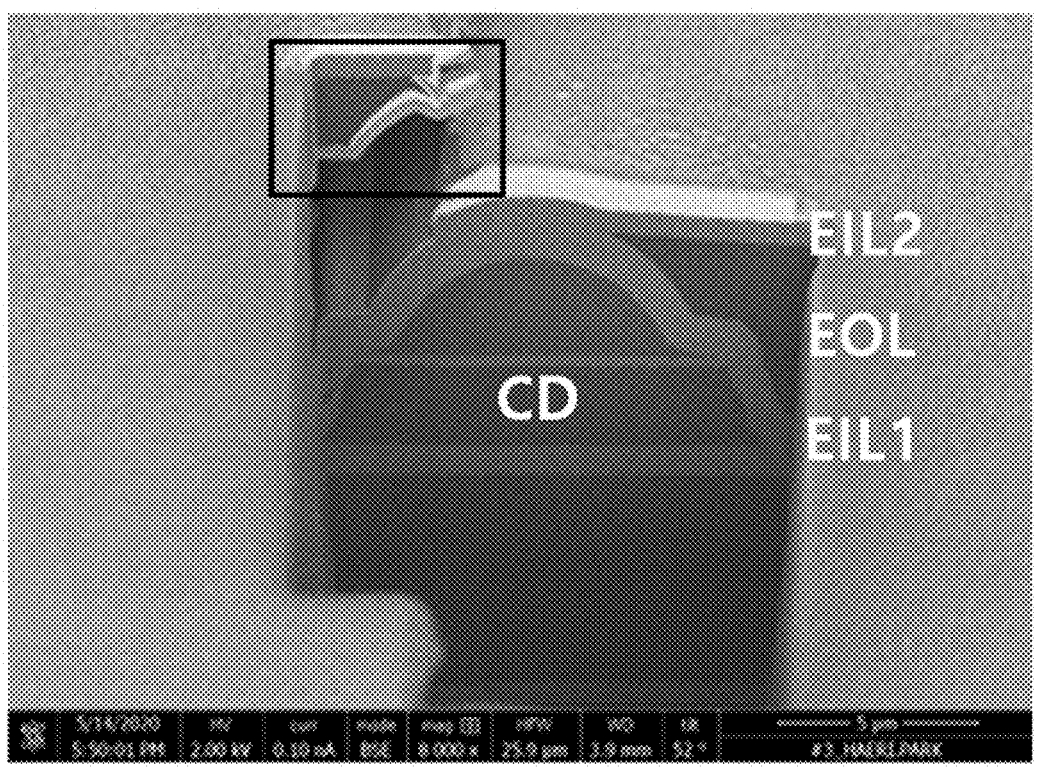
Figure 9C:
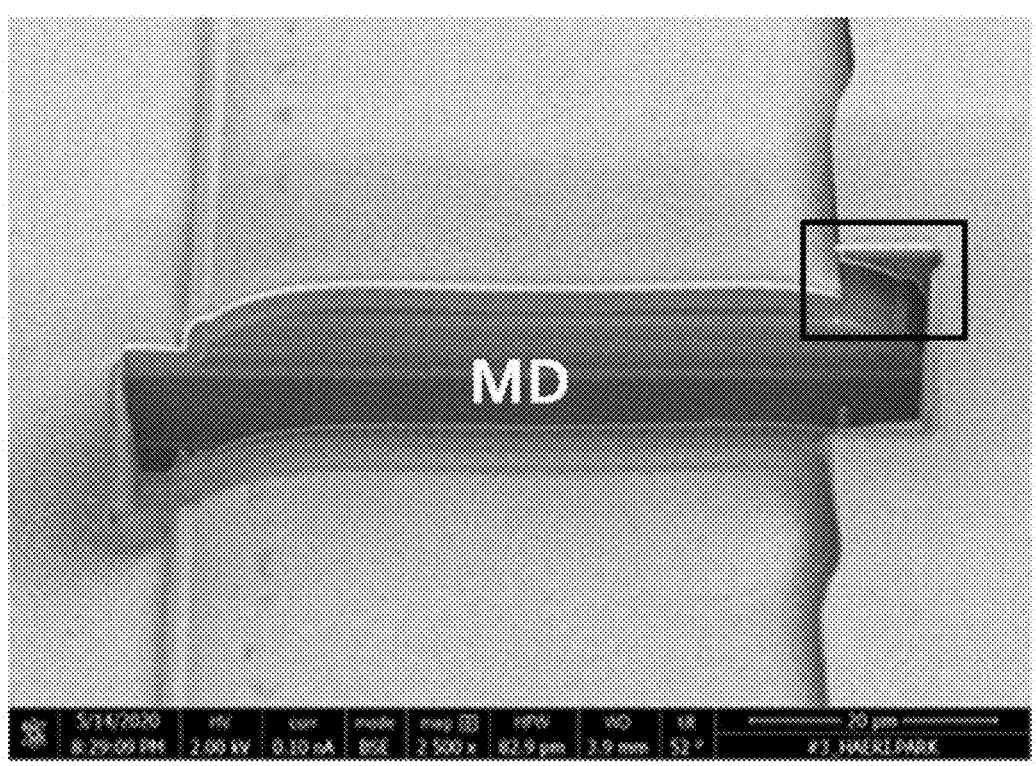

FIG. 9A, FIG. 9B and FIG. 9C are a transmission electron micrograph of a boundary area and a vicinity thereof in a display panel according to a comparative example.

In FIG. 9A, an area R1 is a part of the area where the corner dam CD is disposed, and an area R2 is a part of the area where the main dam MD) is disposed. FIG. 9B shows the cross-section of the area R1, and FIG. 9C represents the cross-section of the area R2. Referring to FIG. 9B, in the stripe area SA, the organic material for forming the organic layer EOL of the encapsulation layer EN overflows the corner dam CD, and then a part of the organic layer EOL is disposed on the upper left of the corner dam CD. Referring to FIG. 9C, in the stripe area SA, the organic material for forming the organic layer EOL of the encapsulation layer EN overflows the corner dam CD and then is positioned on the upper right of the main dam MD of the organic layer EOL.

In this way, in the structure where the corner dam CD surrounding the stripe area SA is separated from the main dam MD, it is difficult to control the flow of the organic material to form the organic layer EOL, and it is difficult to form the organic layer EOL by the inkjet process. However, according to the above-described embodiment, since the main dam MD and the corner dam CD are connected to each other, the organic material for the formation of the organic layer EOL may flow between the main dam MD and the corner dam CD, and it may prevent or suppress the organic material from overflowing the corner dam CD.

A manufacturing method of a display device according to an embodiment will now be described.

FIG. 10, FIG. 11, FIG. 12, FIG. 13, FIG. 14, FIG. 15, FIG. 16, and FIG. 17 are cross-sectional views showing a manufacturing method of a display device according to an embodiment.

Figure 10:
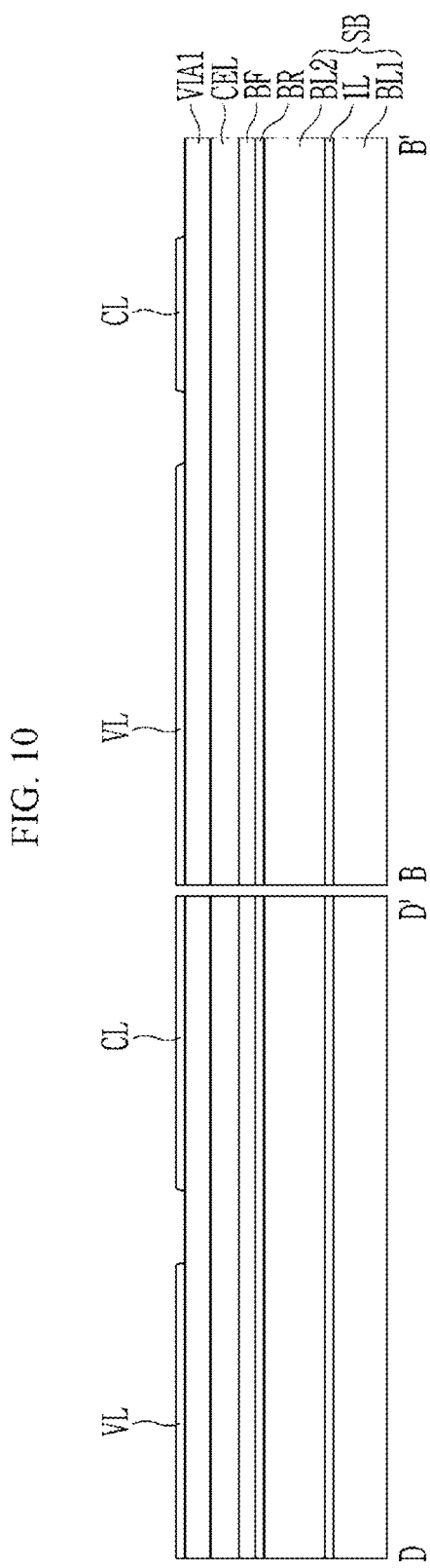
FIG. 10, FIG. 11, FIG. 12, FIG. 13, FIG. 14, FIG. 15, FIG. 16, and FIG. 17 are process cross-sectional views showing a manufacturing method of a display device according to an embodiment.

Referring to FIG. 10, a barrier layer BR, a buffer layer BF, a circuit element layer CEL, and a first planarization layer VIA1 may be sequentially formed on a substrate SB. Next, a conductive layer may be formed on the first planarization layer VIA1 and patterned through a photolithography process to form a second data conductive layer including a voltage line VL and a connection line CL.

Figure 11:
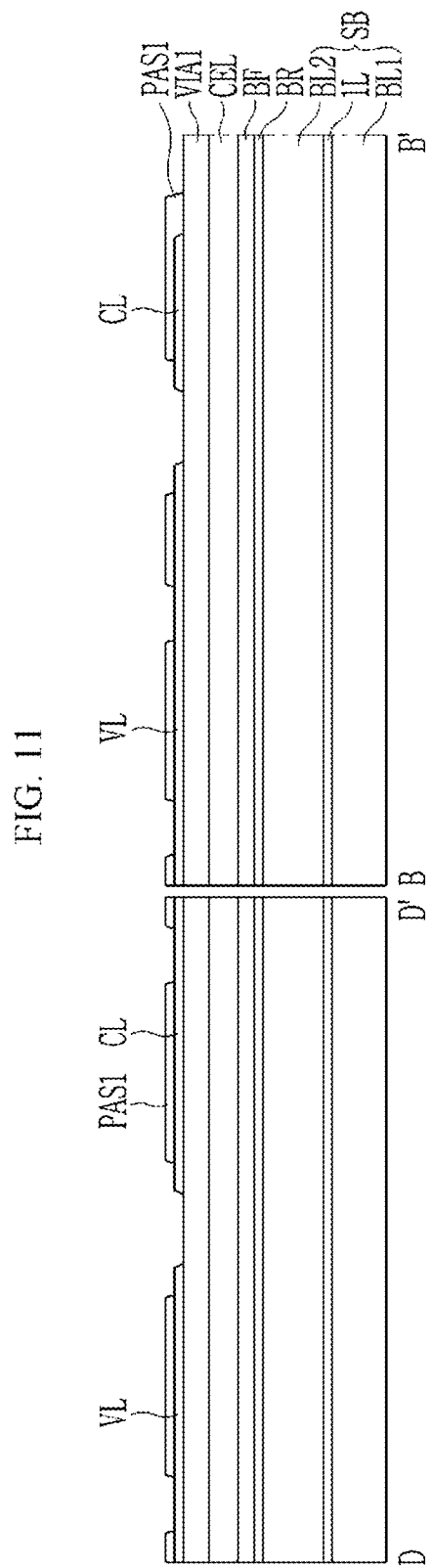

Referring to FIG. 11, an inorganic insulating material may be deposited on the first planarization layer VIA1 and patterned to form a first passivation layer PAS1. The first passivation layer PAS1 may be formed between the main dam MD and the edge of the substrate SB, between the main dam MD and the spacer SP, between the spacer SP and the light emitting diode LED, between the corner dam CD and the edge of the substrate SB, and between the corner dam CD and the light emitting diode LED.

Figure 12:
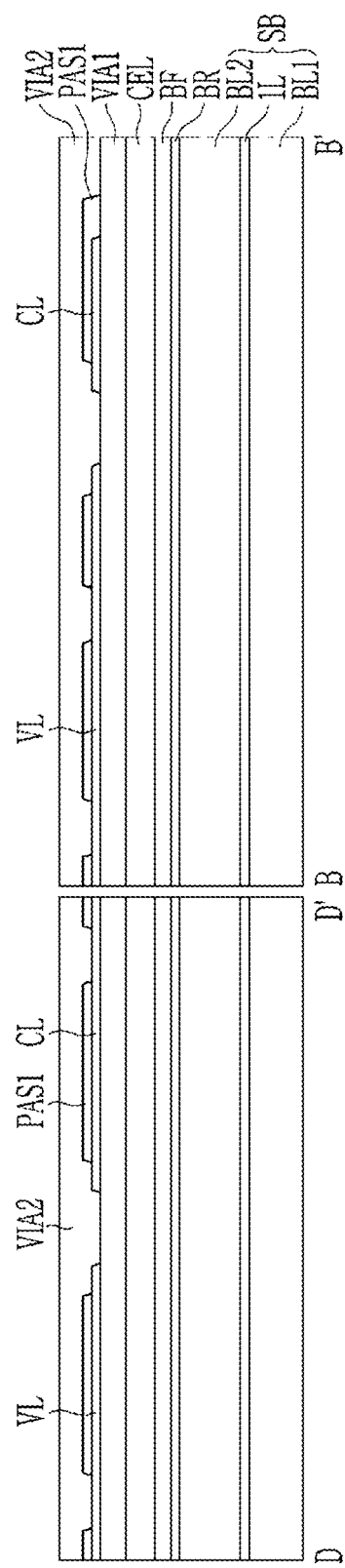

Referring to FIG. 12, an organic insulating material may be coated on the first passivation layer PAS1 to form a second planarization layer VIA2.

Figure 13:
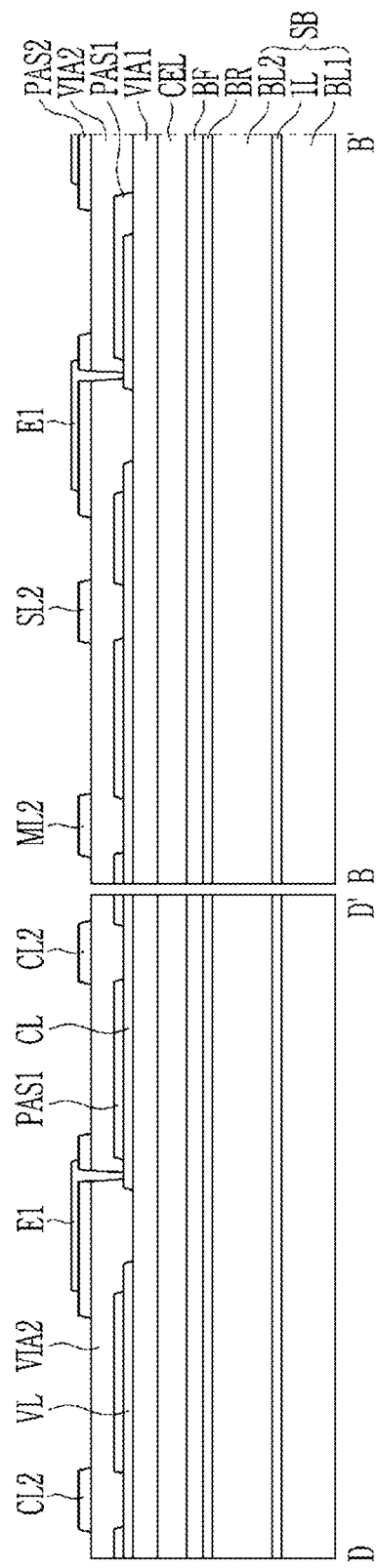

Referring to FIG. 13, an inorganic insulating material may be deposited on the second planarization layer VIA2 and patterned to form a second passivation layer PAS2, a second layer ML2 of a main dam MD, a second layer CL2 of a corner dam CD, a second layer SL2 of a spacer SP and contact holes for a first electrode E1 which will be described later. As such, the second passivation layer PAS2, the second layer ML2 of the main dam MD, the second layer CL2 of the corner dam CD, the second layer SL2 of the spacer SP and the contact holes may be formed of the same material in the same process. Next, a first electrode E1 of a light emitting diode LED may be formed on the second passivation layer PAS2.

Figure 14:
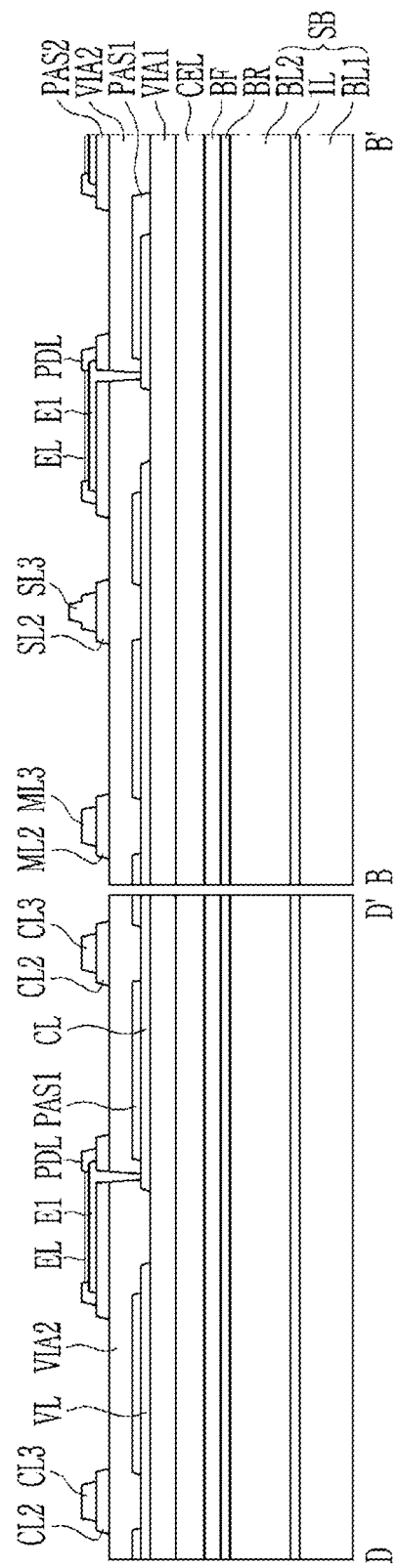

Referring to FIG. 14, an organic insulating material may be coated and patterned to form a pixel definition layer PDL, a third layer ML3 of the main dam MD, a third layer CL3 of the corner dam CD, and a third layer SL3 of the spacer SP. In this case, the third layer SL3 of the spacer SP may be formed thicker than the third layer ML3 of the main dam MD and/or the pixel definition layer PDL using a half-tone mask. Since the third layer SL3 of the spacer SP is formed thicker than the third layer ML3 of the main dam MD and the third layer CL3 of the corner dam CD, the spacer SP may be formed higher than the main dam MD and the corner dam CD. As such, the pixel definition layer PDL, the third layer ML3 of the main dam MD, the third layer CL3 of the corner dam CD and the third layer SL3 of the spacer SP may be formed of the same material in the same process. Then, using a fine metal mask, an emission layer EL may be formed in the opening of the pixel definition layer PDL.

Figure 15:
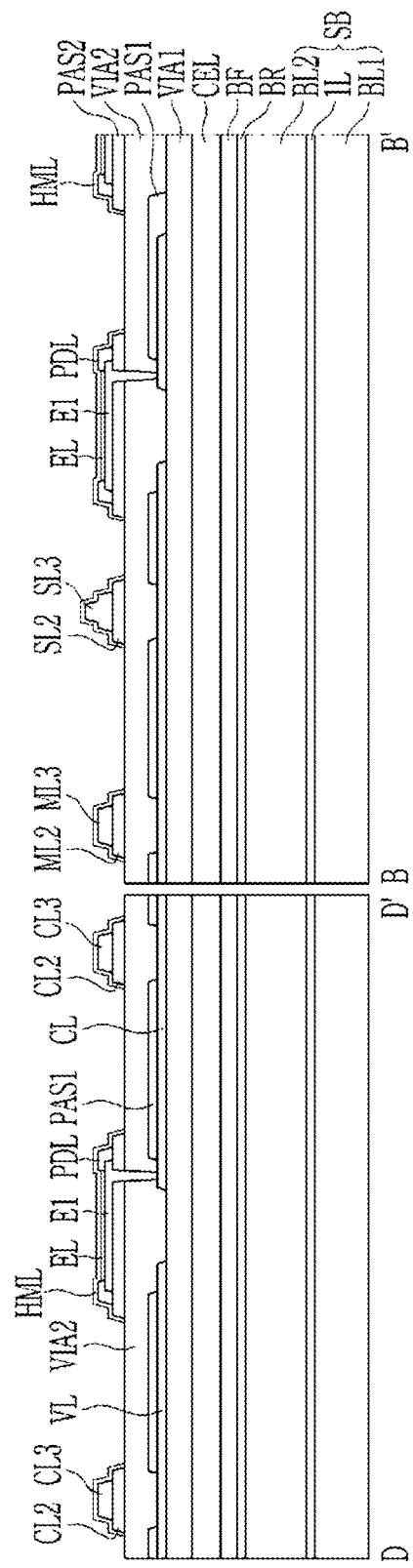

Referring to FIG. 15, an inorganic insulating material is deposited and patterned to form a hard mask layer HML. The hard mask layer HML may be formed to overlap the pixel definition layer PDL, the emission layer EL, the second layer ML2 and the third layer ML3 of the main dam MD, the second layer CL2 and the third layer CL3 of the corner dam CD, and the second layer SL2 and the third layer SL3 of the spacer SP.

Figure 16:
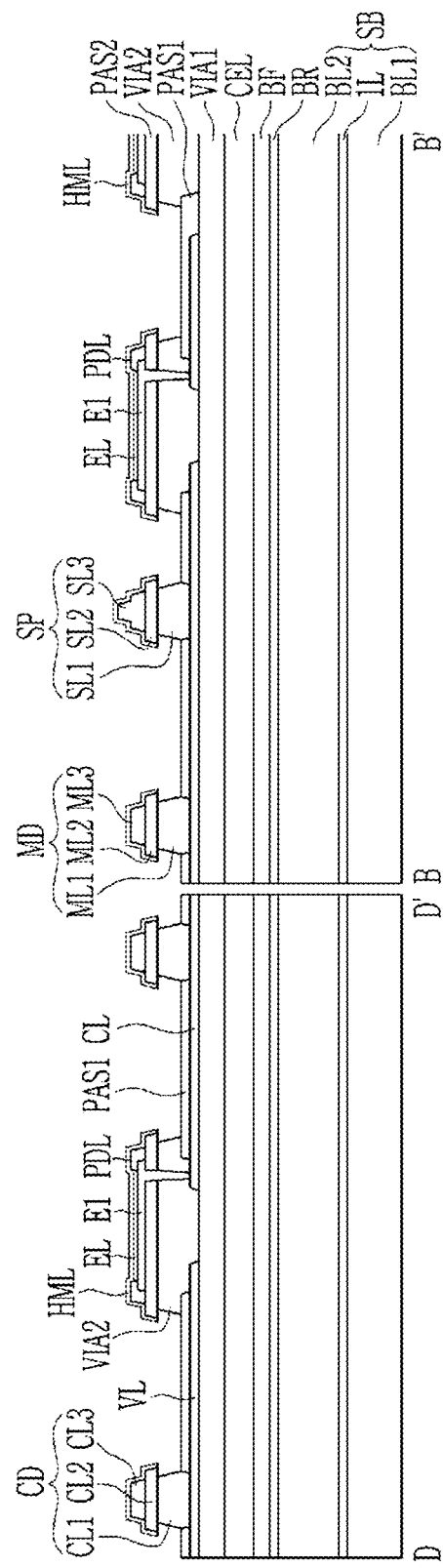

Referring to FIG. 16, a part of the second planarization layer VIA2 may be etched (e.g., by dry etching) by using the hard mask layer HML as a mask. In this case, the first passivation layer PAS1 may function as an etch stopper. That is, the first passivation layer PAS1 may prevent the first planarization layer VIA1 thereunder from being etched while only the second planarization layer VIA2 is etched. The portion positioned between the light emitting diodes LED in the second planarization layer VIA2 may or may not be etched as illustrated. By the partial etching of the second planarization layer VIA2, the first layer ML1 of the main dam MD, the first layer CL1 of the corner dam CD, and the first layer SL1 of the spacer SP may be formed. As above-described, the second planarization layer VIA2, the first layer ML1 of the main dam MD, the first layer CL1 of the corner dam CD, and the first layer SL1 of the spacer SP may be formed of the same material in the same process.

Figure 17:
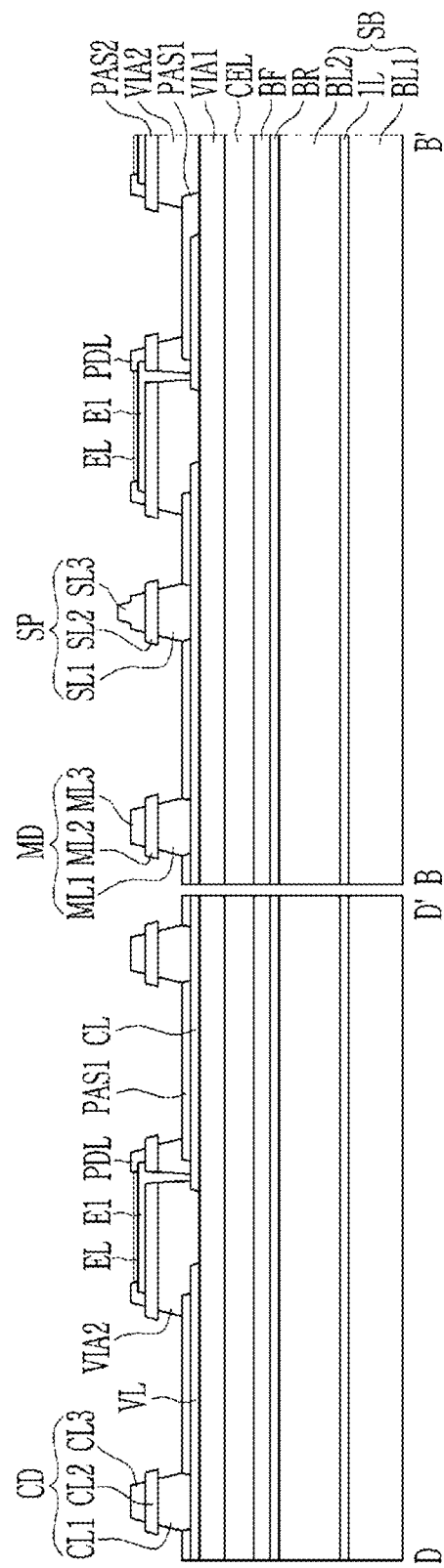

Referring to FIG. 17, the hard mask layer HML disposed on the main dam MD, the corner dam CD, the spacer SP, the pixel definition layer PDL, and the first electrode E1 may be removed by a method such as dry etching. Thereafter, the second electrode E2 is formed, and then a first inorganic layer EIL1, an organic layer EOL, and a second the inorganic layer EIL2 of the encapsulation layer EN may be sequentially formed to manufacture the display panel 10 as shown in FIG. 3 to FIG. 6. By attaching the thus manufactured display panel 10 to the window 20 by the adhesive layer 30, the display device 100 as shown in FIG. 2 may be manufactured.

FIG. 18, FIG. 19, FIG. 20, FIG. 21, and FIG. 22 are top plan views schematically showing a part of a corner area and a front area adjacent thereto in a display panel according to an embodiment, respectively.

The number, the shape, and the position of the spacer SPs that may be disposed adjacent to the corner area A3 in the front area A1 may be changed in various ways.

Figure 18:
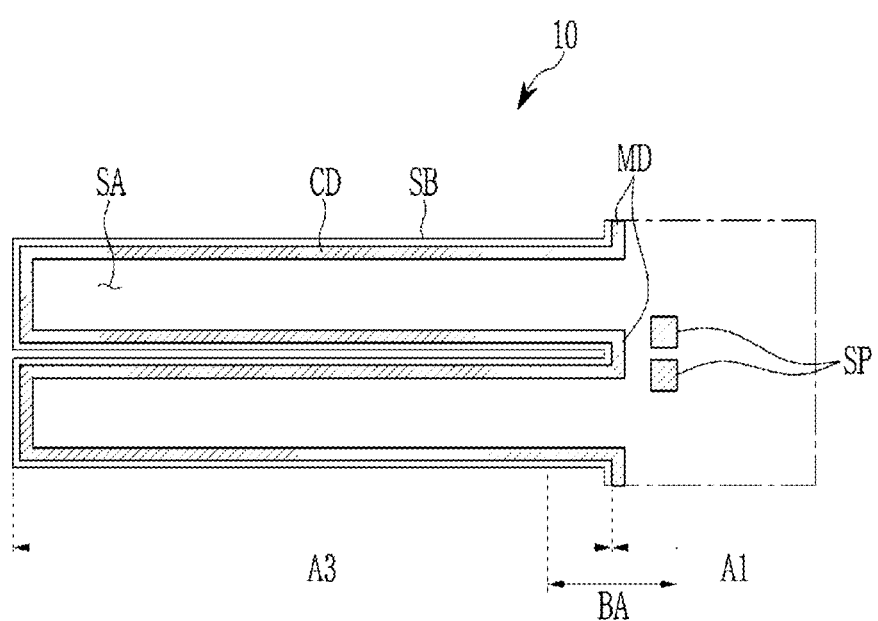
FIG. 18, FIG. 19, FIG. 20, FIG. 21, and FIG. 22 are top plan views schematically showing a part of a corner area and a front area adjacent thereto in a display panel according to an embodiment, respectively.

For example, referring to FIG. 18, two or more spacers SP may be disposed between adjacent stripe areas SA. The number of the spacers SP may be varied to benefit from controlling the flow of the material for forming the organic layer of the encapsulation layer EN depending on the width or the spacing of the stripe areas SA.

Figure 19:
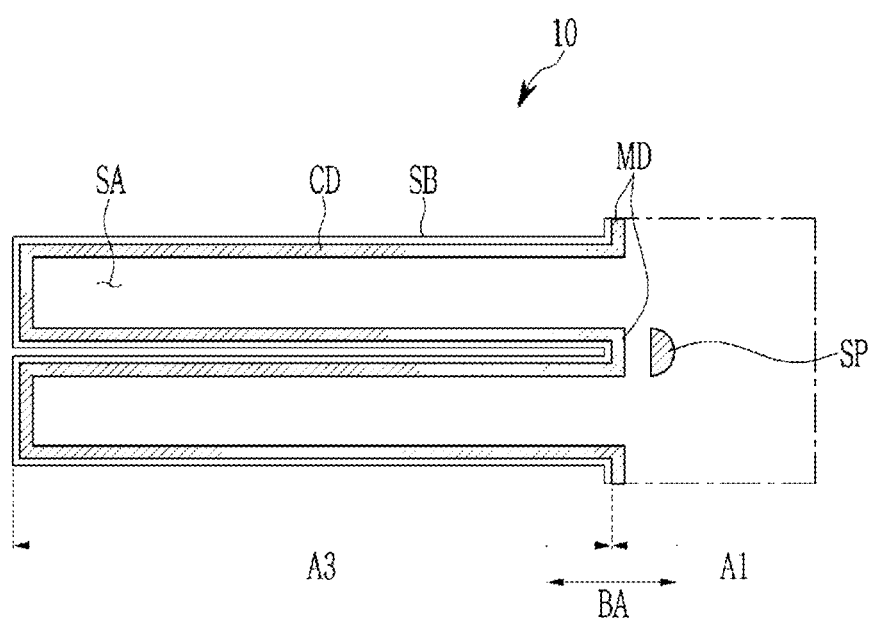
Figure 20:
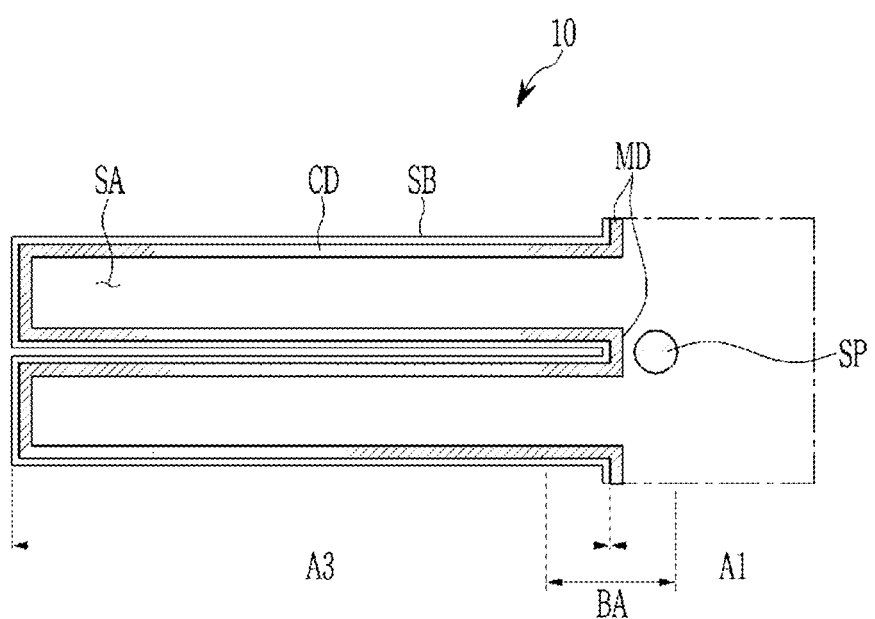
Figure 21:
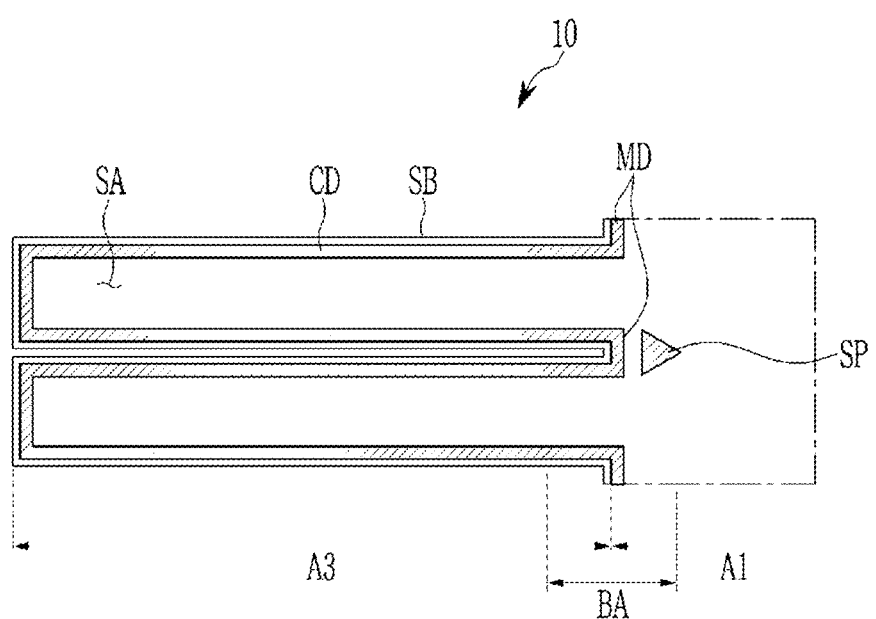

Referring to FIG. 19, FIG. 20, and FIG. 21, the spacer SP may have semicircular, circular, or triangular shape. This shape of the spacer SP may be advantageous in directing the flow of the material for forming the organic layer of the encapsulation layer EN from the front area A1 to the stripe areas SA.

Figure 22:
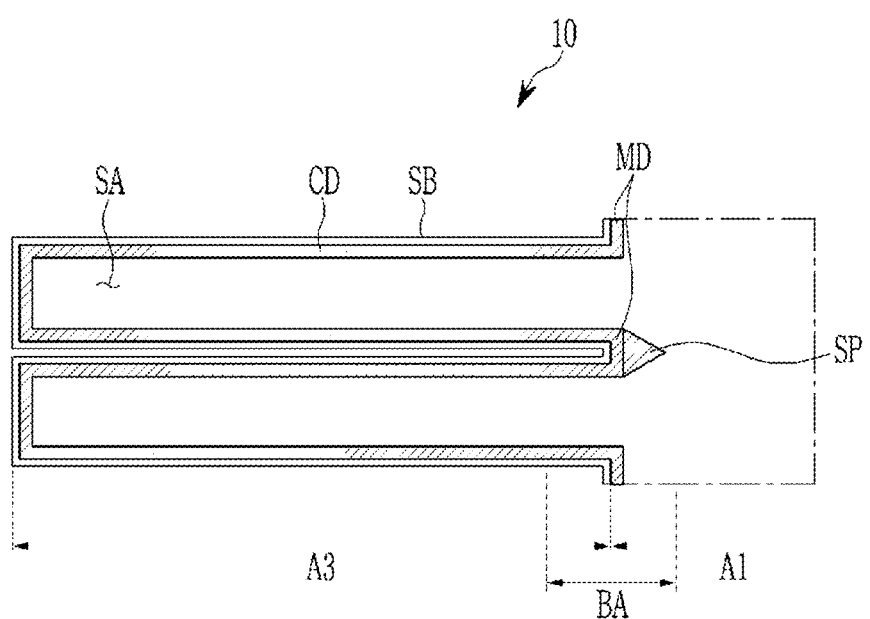

Referring to FIG. 22, the spacer SP may be disposed adjacent to the main dam MD. In a layout view, the spacer SP may be protruded from the main dam MD toward the front area A1. The spacer SP may be formed higher than the main dam MD and support the mask used for forming the emission layer EL, thereby preventing the main dam MD from being damaged. The arrangement of the spacer SP may be a case where it is difficult to form the spacer SP apart from the main dam MD for reasons such as process dispersion.

Figure 23:
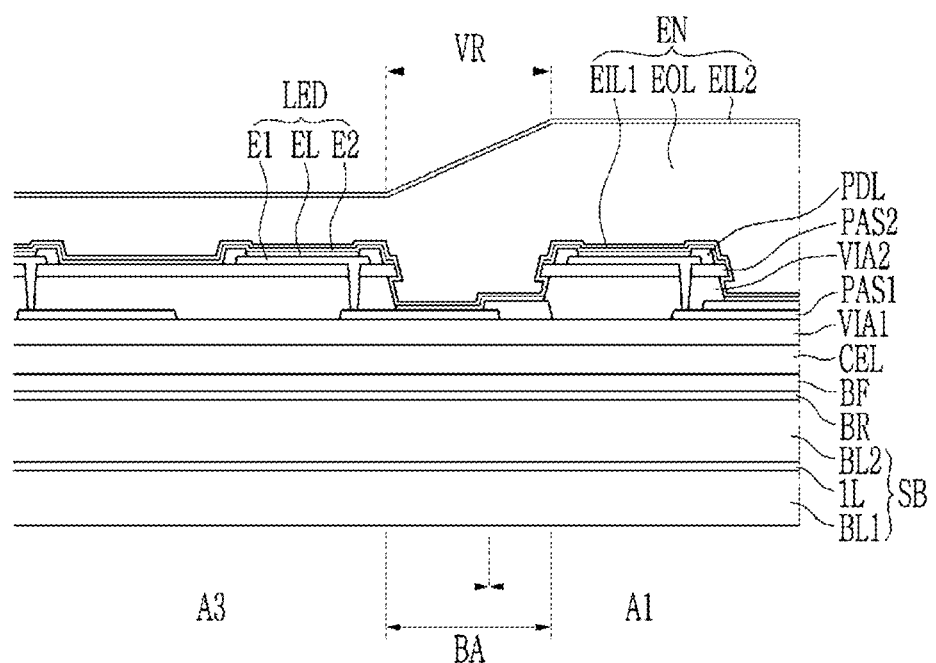
FIG. 23, FIG. 24, and FIG. 25 are schematic cross-sectional views of a vicinity of a boundary area in a display panel according to an embodiment, respectively.
Figure 24:
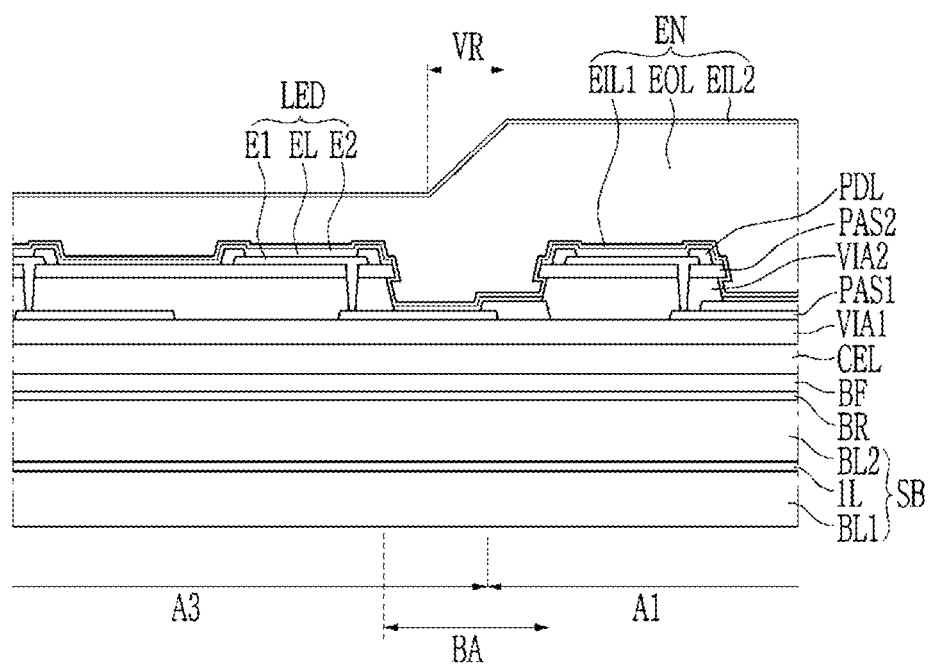
Figure 25:
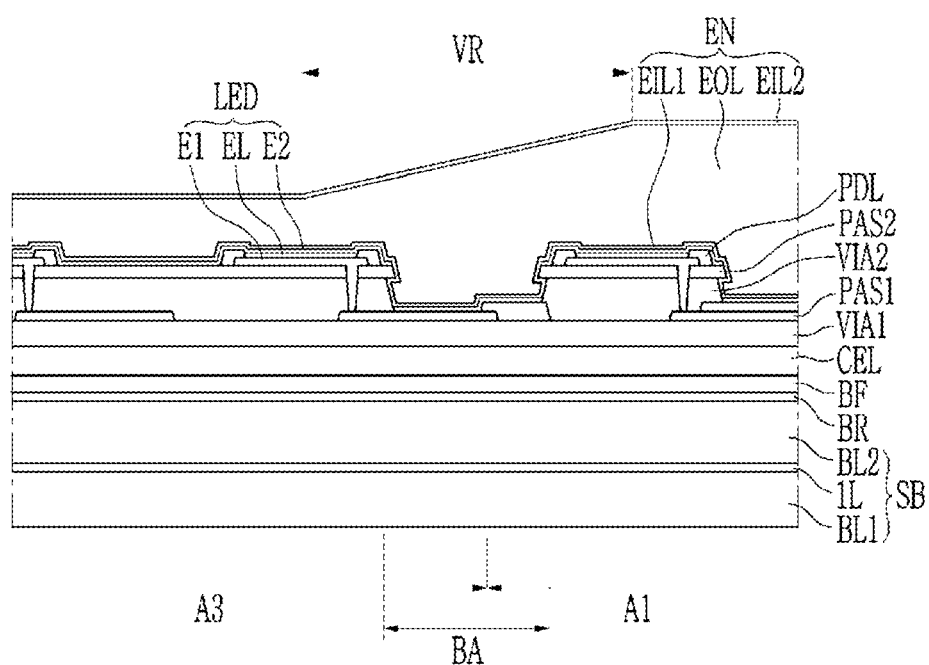

FIG. 23, FIG. 24, and FIG. 25 are schematic cross-sectional views of a vicinity of a boundary area in a display panel according to an embodiment, respectively. In the organic layer EOL of the encapsulation layer EN, the width of the thickness change portion VR may be variously changed. Referring to FIG. 23, the thickness change portion VR of the organic layer EOL may be the same or almost the same as the boundary area BA. Referring to FIG. 24, the thickness change portion VR of the organic layer EOL may be narrower than the boundary area within the boundary area BA. Referring to FIG. 25, the thickness change portion VR of the organic layer EOL may be wider than the boundary area BA. In any case, by positioning the thickness change portion VR of the organic layer EOL in the boundary area BA, it is possible to minimize the boundary between the front area A1 and the corner area A3 from being recognized.

The configuration of the display panel 10 that may be included in the display device according to an embodiment is described focusing on the front area A1. However, the structure of the area adjacent to the corner area A3 in the front area A1 may be the same as described above with reference to FIG. 3 to FIG. 5.

Figure 26:
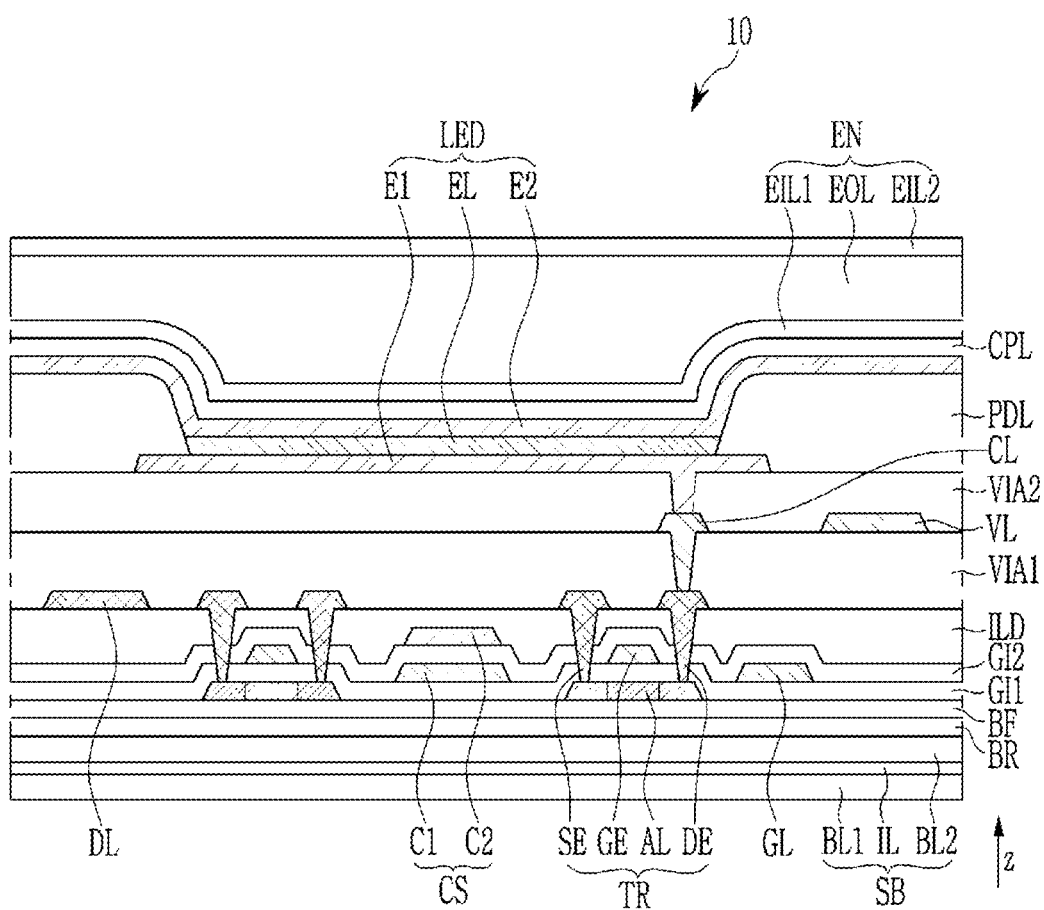
FIG. 26 is a cross-sectional view schematically showing a laminated structure of a display panel according to an embodiment.

FIG. 26 is a cross-sectional view schematically showing a laminated structure of a display panel according to an embodiment. The cross-section shown in FIG. 26 may correspond to approximately one pixel area.

The display panel 10 basically includes a substrate SB, a circuit element layer CEL including a transistor TR formed on the substrate SB, and a light emitting diode LED connected to the transistor TR. The light emitting diode LED may be formed to correspond to the pixel.

The substrate SB may be a flexible substrate including a polymer such as a polyimide, a polyamide, or polyethylene terephthalate.

A barrier layer BR may be disposed on the substrate SB to prevent penetration of moisture and oxygen. The barrier layer BR may include an inorganic insulating material and may be a single layer or multiple layers.

A buffer layer BF may be disposed on the barrier layer BR. The buffer layer BF blocks impurities from the substrate SB diffused into the semiconductor layer when the semiconductor layer is formed, thereby improving the characteristics of the semiconductor layer, and flattens the surface of the substrate SB, thereby reducing the stress of the semiconductor layer. The buffer layer BF may include an inorganic insulating material and may be a single layer or multiple layers. The buffer layer BF may include amorphous silicon (Si).

A semiconductor layer AL of the transistor TR may be disposed on the buffer layer BF. The semiconductor layer AL may include a first area, a second area, and a channel area disposed between the first area and the second area. The semiconductor layer AL may include any one of amorphous silicon, polysilicon, and an oxide semiconductor. For example, the semiconductor layer AL may include a low temperature polysilicon (LTPS) or an oxide semiconductor material including at least one of zinc (Zn), indium (In), gallium (Ga), and tin (Sn). For example, the semiconductor layer AL may include indium-gallium-zinc oxide (IGZO).

A first gate insulating layer GI1 may be disposed on the semiconductor layer AL. The first gate insulating layer GI1 may include inorganic insulating materials such as a silicon nitride, a silicon oxide, and a silicon oxynitride, and may be a single layer or multiple layers.

On the first gate insulating layer GI1, a first gate conductive layer including a gate electrode GE of the transistor TR, a gate line GL, and a first electrode C1 of the capacitor CS may be disposed. The first gate conductive layer may include molybdenum (Mo), aluminum (Al), copper (Cu), titanium (Ti), and the like, and may be a single layer or multiple layers.

A second gate insulating layer GI2 may be disposed on the first gate conductive layer. The second gate insulating layer GI2 may include inorganic insulating materials such as a silicon nitride, a silicon oxide, and a silicon oxynitride, and may be a single layer or multiple layers.

On the second gate insulating layer GI2, a second gate conductive layer including a second electrode C2 of the capacitor CS may be disposed. The second gate conductive layer may include molybdenum (Mo), aluminum (Al), copper (Cu), titanium (Ti), and the like, and may be a single layer or multiple layers.

An interlayer insulating layer ILD may be disposed on the second gate insulating layer GI2 and the second gate conductive layer. The interlayer insulating layer ILD may include inorganic insulating materials such as a silicon nitride, a silicon oxide, and a silicon oxynitride, and may be a single layer or multiple layers.

On the interlayer insulating layer ILD, a first data conductive layer including a first electrode SE and a second electrode DE of the transistor TR, and a data line DL may be disposed. The first electrode SE and the second electrode DE may be connected to the first area and the second area of the semiconductor layer AL through contact holes formed in the insulating layers GI1, GI2, and ILD, respectively. One of the first electrode SE and the second electrode DE may be the source electrode and the other may be the drain electrode. The first data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), copper (Cu), and the like, and may be a single layer or multiple layers.

A first planarization layer VIA1, which may be an organic insulating layer, may be disposed on the first data conductive layer. On the first planarization layer VIA1, a second data conductive layer that may include a voltage line VL and a connection line CL may be disposed. The voltage line VL may transmit voltages such as a driving voltage, a common voltage, an initialization voltage, and a reference voltage. The connection line CL may be connected to the second electrode DE of the transistor TR through the contact hole formed in the first planarization layer VIAL The second data conductive layer may include a metal and may be a single layer or multiple layers.

A second planarization layer VIA2, which may be an organic insulating layer, may be disposed on the second data conductive layer.

A first electrode E1 of the light emitting diode LED may be disposed on the second planarization layer VIA2. The first electrode E1 may be referred to as the pixel electrode. The first electrode E1 may be connected to the connection line CL through the contact hole formed in the second planarization layer VIA2. Therefore, the first electrode E1 is electrically connected to the second electrode DE of the transistor TR so that the data signal controlling the luminance of the light emitting diode LED may be received. The transistor TR to which the first electrode E1 is connected may be a driving transistor or a transistor that is electrically connected to the driving transistor. The first electrode E1 may be formed of a reflective conductive material, a semi-transmissive conductive material, or a transparent conductive material. The first electrode E1 may include a transparent conductive material such as an indium tin oxide (ITO) or an indium zinc oxide (IZO). The first electrode E1 may include a metal or metal alloy such as lithium (Li), calcium (Ca), aluminum (Al), silver (Ag), magnesium (Mg), and gold (Au).

The above-described circuit element layer CEL may include layers disposed between the buffer layer BF and the first planarization layer VIA1, and particularly may include the transistor TR and the capacitor CS. The above-described first passivation layer PAS1 and/or second passivation layer PAS2 may not be disposed in an area other than the area adjacent to the corner area A3 of the front area A1 of the display panel 10.

A pixel definition layer PDL, which may be an organic insulating layer, may be disposed on the second planarization layer VIA2. The pixel definition layer PDL may be called a partition wall and may have an opening exposing the first electrode E1.

On the first electrode E1, an emission layer EL of the light emitting diode LED may be disposed. On the first electrode E1, in addition to the emission layer EL, at least one of a hole injection layer, a hole transport layer, an electron transport layer, and an electron injection layer may be disposed.

A second electrode E2 of the light emitting diode LED may be disposed on the emission layer EL. The second electrode E2 may be referred to as the common electrode. The second electrode E2 has light transmittance by forming a thin layer of a metal or a metal alloy having a low work function such as calcium (Ca), barium (Ba), magnesium (Mg), aluminum (Al), silver (Ag), or the like. The second electrode E2 may include a transparent conductive oxide such as an indium tin oxide (ITO) or an indium zinc oxide (IZO).

The first electrode E1, the emission layer EL, and the second electrode E2 of each pixel form a light emitting diode LED such as an organic light emitting diode. The first electrode E1 may be the anode of the light emitting diode LED and the second electrode E2 may be the cathode of the light emitting diode LED.

A capping layer CPL may be disposed on the second electrode E2. The capping layer CPL may improve optical efficiency through a refractive index adjustment. The capping layer CPL may be disposed to cover the entire second electrode E2. The capping layer CPL may include an organic insulating material or may include an inorganic insulating material.

An encapsulation layer EN may be disposed on the capping layer CPL. The encapsulation layer EN may prevent the penetration of moisture or oxygen from the outside by encapsulating the light emitting diode LED. The encapsulation layer EN may be a thin film encapsulation layer including at least one of inorganic layers EIL1 and EIL2 and at least one organic layer EOL.

A touch sensor layer (not shown) including touch electrodes may be disposed on the encapsulation layer EN. An anti-reflection layer (not shown) for reducing reflection of external light may be disposed on the touch sensor layer.

A protective film (not shown) for protecting the display panel 10 may be disposed under the substrate SB. Under the protective film, a functional sheet (not shown) including at least one of a cushion layer, a heat dissipation sheet, a light shielding sheet, a waterproof tape, and an electromagnetic blocking film may be disposed.

While the inventive concept has been described in connection with what is presently considered to be practical embodiments, it is to be understood that the inventive concept is not limited to the disclosed embodiments. On the contrary, it is intended to cover various modifications and equivalent arrangements included within the spirit and scope of the appended claims.

What is claimed is:

1. A display device comprising:
   a substrate including a display area, the display area including a front area and a corner area disposed at a corner of the display area;
   a main dam disposed between the front area and the corner area; and
   a plurality of corner dams disposed in the corner area,
   wherein the corner area includes a plurality of stripe areas defined by the plurality of corner dams and the plurality of corner dams extend from the main dam and is disposed along an edge of the plurality of stripe areas.

2. The display device of claim 1, wherein the substrate in the plurality of stripe areas are separated from each other.

3. The display device of claim 1, wherein the front area has a flat surface, the corner area has a multi-curved surface and the plurality of stripe areas form the multi-curved surface of the corner area.

4. The display device of claim 1, wherein portions of the plurality of corner dams disposed at each of the plurality of stripe areas are connected to the main dam to form stripe areas connect to the front area.

5. The display device of claim 1, further comprising:
   a plurality of light emitting diodes disposed in the front area and the plurality of stripe areas; and
   an encapsulation layer covering the plurality of light emitting diodes,
   wherein the encapsulation layer includes an organic layer and the organic layer is continuously disposed over the front area and the plurality of stripe areas.

6. The display device of claim 5, wherein a thickness of the organic layer in the corner area is thinner than that in the front area.

7. The display device of claim 6, wherein the thickness of the organic layer is changed in a boundary area disposed between the front area and the corner area.

8. The display device of claim 5, further comprising at least one spacer disposed in the front area adjacent to the corner area and disposed corresponding to an area disposed between adjacent stripe areas of the plurality of stripe areas.

9. The display device of claim 8, wherein the height of the spacer is higher than a height of the main dam.

10. The display device of claim 8, wherein the spacer is covered by the organic layer.

11. The display device of claim 8, wherein the spacer has a polygonal, circular, or semicircular shape in a plan view.

12. The display device of claim 8, wherein the spacer is disposed spaced apart from the main dam or in contact with the main dam.

13. The display device of claim 1, wherein the main dam and the plurality of corner dams each includes a first layer, a second layer, and a third layer that are sequentially stacked, the first layer and the third layer include an organic insulating material, and the second layer includes an inorganic insulating material.

14. The display device of claim 13, wherein the second layer is protruded from a top of the first layer in a cross-sectional view.

15. A display device comprising:
   a substrate including a display area, the display area including a front area and a corner area disposed at the corner of the display area;
   a plurality of light emitting diodes disposed in the display area; and
   an encapsulation layer covering the plurality of light emitting diodes and including an organic layer and an inorganic layer,
   wherein a thickness of the organic layer disposed in the corner area is thinner than that in the front area.

16. The display device of claim 15, wherein the organic layer is disposed continuously over the front area and the corner area.

17. The display device of claim 16, wherein the thickness of the organic layer is gradually changed in a boundary area disposed between the front area and the corner area.

18. The display device of claim 15, wherein an interval between a first light emitting diode disposed adjacent to the corner area in the front area and a second light emitting diode disposed adjacent to the first light emitting diode in the corner area is the same as an interval between light emitting diodes disposed adjacent to each other in the front area.

19. The display device of claim 15, further comprising:
   a main dam disposed between the front area and the corner area; and
   a plurality of corner dams disposed in the corner area,
   wherein the corner area includes a plurality of stripe areas defined by the plurality of corner dams and the main dam and the plurality of corner dams are continuously formed.

20. The display device of claim 19, further comprising a spacer disposed adjacent to the corner area in the front area and has a height higher than that of the main dam.

* * * * *